United States Patent
Verhaverbeke et al.

(10) Patent No.: US 11,011,392 B2
(45) Date of Patent: May 18, 2021

(54) STICTION-FREE DRYING PROCESS WITH CONTAMINANT REMOVAL FOR HIGH-ASPECT RATIO SEMICONDUCTOR DEVICE STRUCTURES

(71) Applicant: Applied Materials, Inc., Santa Clara, CA (US)

(72) Inventors: Steven Verhaverbeke, San Francisco, CA (US); Han-Wen Chen, Cupertino, CA (US); Roman Gouk, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/422,477

(22) Filed: May 24, 2019

(65) Prior Publication Data

US 2019/0287823 A1    Sep. 19, 2019

Related U.S. Application Data

(62) Division of application No. 14/078,373, filed on Nov. 12, 2013, now Pat. No. 10,354,892.

(Continued)

(51) Int. Cl.
*H01L 21/02* (2006.01)
*B08B 3/08* (2006.01)
(Continued)

(52) U.S. Cl.
CPC .......... *H01L 21/67034* (2013.01); *B08B 3/08* (2013.01); *B08B 7/0021* (2013.01);
(Continued)

(58) Field of Classification Search
None
See application file for complete search history.

(56) References Cited

U.S. PATENT DOCUMENTS 5,013,688 A * 5/1991 Yamazaki ............... H01L 21/56
257/E21.502
5,417,768 A    5/1995 Smith, Jr. et al.
(Continued)

FOREIGN PATENT DOCUMENTS

CN    1958177 A    5/2007
CN    1960813 A    5/2007
(Continued)

OTHER PUBLICATIONS

English Machine Translation of WO 2012133583.*
(Continued)

*Primary Examiner* — Nicole Blan
(74) *Attorney, Agent, or Firm* — Patterson + Sheridan LLP

(57) ABSTRACT

Embodiments of the present disclosure generally relate to a method of cleaning a substrate. More specifically, embodiments of the present disclosure relate to a method of cleaning a substrate in a manner that reduces or eliminates the negative effects of line stiction between semiconductor device features. In an embodiment, a method of cleaning a substrate includes exposing a substrate having high aspect ratio features formed thereon to a first solvent to remove an amount of a residual cleaning solution disposed on a surface of the substrate, exposing the surface of the substrate to a second solvent to remove the first solvent disposed on the surface of the substrate, exposing the surface of the substrate to a supercritical fluid to remove the second solvent disposed on the surface of the substrate, and exposing the surface of the substrate to electromagnetic energy.

17 Claims, 14 Drawing Sheets

Related U.S. Application Data

(60) Provisional application No. 61/841,779, filed on Jul. 1, 2013, provisional application No. 61/729,965, filed on Nov. 26, 2012.

(51) Int. Cl.
  *B08B 7/00* (2006.01)
  *H01L 21/67* (2006.01)
  *H01L 21/677* (2006.01)

(52) U.S. Cl.
  CPC .. *H01L 21/02057* (2013.01); *H01L 21/02101* (2013.01); *H01L 21/67051* (2013.01); *H01L 21/67109* (2013.01); *H01L 21/67126* (2013.01); *H01L 21/67742* (2013.01)

(56) References Cited

U.S. PATENT DOCUMENTS

| | | | |
|---|---|---|---|
| 5,417,826 A * | 5/1995 | Blalock | B08B 7/0035 |
| | | | 110/236 |
| 5,882,433 A | 3/1999 | Ueno | |
| 6,024,801 A | 2/2000 | Wallace et al. | |
| 6,286,231 B1 | 9/2001 | Bergman et al. | |
| 6,306,564 B1 | 10/2001 | Mullee | |
| 6,334,266 B1 | 1/2002 | Moritz et al. | |
| 6,372,657 B1 * | 4/2002 | Hineman | H01L 21/02046 |
| | | | 134/1.2 |
| 6,508,259 B1 | 1/2003 | Tseronis et al. | |
| 6,562,146 B1 | 5/2003 | DeYoung et al. | |
| 6,576,066 B1 | 6/2003 | Namatsu | |
| 6,745,494 B2 | 6/2004 | Bergman et al. | |
| 6,764,552 B1 | 7/2004 | Joyce et al. | |
| 6,793,836 B2 | 9/2004 | Tsung-Kuei et al. | |
| 6,843,855 B2 | 1/2005 | Verhaverbeke | |
| 7,000,621 B1 | 2/2006 | Verhaverbeke | |
| 7,384,484 B2 | 6/2008 | Muraoka et al. | |
| 2002/0195121 A1 | 12/2002 | Kittle | |
| 2003/0022487 A1 | 1/2003 | Yoon et al. | |
| 2003/0026677 A1 | 2/2003 | Sakashita et al. | |
| 2003/0075536 A1 | 4/2003 | Mack et al. | |
| 2003/0084918 A1 | 5/2003 | Kim | |
| 2003/0102017 A1 | 6/2003 | Taniyama | |
| 2003/0172954 A1 * | 9/2003 | Verhaverbeke | B08B 3/12 |
| | | | 134/1.3 |
| 2003/0228755 A1 | 12/2003 | Esry et al. | |
| 2004/0072706 A1 | 4/2004 | Arena-Foster et al. | |
| 2004/0134515 A1 | 7/2004 | Castrucci | |
| 2004/0198066 A1 | 10/2004 | Verhaverbeke | |
| 2004/0221875 A1 | 11/2004 | Saga et al. | |
| 2005/0191861 A1 | 9/2005 | Verhaverbeke | |
| 2005/0242064 A1 | 11/2005 | Saito et al. | |
| 2006/0008747 A1 | 1/2006 | Kawamura et al. | |
| 2006/0211163 A1 * | 9/2006 | Ouellet | B81C 1/00476 |
| | | | 438/50 |
| 2007/0221252 A1 | 9/2007 | Kiyose | |
| 2007/0287277 A1 | 12/2007 | Kolics et al. | |
| 2007/0295365 A1 | 12/2007 | Miya et al. | |
| 2008/0153276 A1 | 6/2008 | Hwang et al. | |
| 2008/0224379 A1 | 9/2008 | McNamara | |
| 2009/0117736 A1 * | 5/2009 | Mebarki | H01L 21/02063 |
| | | | 438/660 |
| 2009/0151754 A1 | 6/2009 | Zhu et al. | |
| 2009/0203566 A1 | 8/2009 | Lee et al. | |
| 2010/0035177 A1 * | 2/2010 | Ishikawa | G03F 7/0035 |
| | | | 430/270.1 |
| 2011/0146909 A1 | 6/2011 | Shih et al. | |
| 2012/0055405 A1 | 3/2012 | Koelmel et al. | |
| 2012/0085495 A1 | 4/2012 | Lee et al. | |
| 2012/0103264 A1 | 5/2012 | Choi et al. | |
| 2012/0149161 A1 | 6/2012 | Ohki et al. | |
| 2012/0240426 A1 | 9/2012 | Hayashi et al. | |
| 2012/0304485 A1 | 12/2012 | Hayashi et al. | |
| 2013/0194350 A1 | 8/2013 | Watanabe et al. | |
| 2013/0302982 A1 | 11/2013 | Tung et al. | |
| 2013/0318812 A1 | 12/2013 | Kim et al. | |
| 2014/0130367 A1 | 5/2014 | Yonekawa | |
| 2014/0144462 A1 | 5/2014 | Verhaverbeke et al. | |
| 2015/0221539 A1 | 8/2015 | Ouye | |
| 2015/0262859 A1 | 9/2015 | Balasubramanian et al. | |

FOREIGN PATENT DOCUMENTS

| | | | |
|---|---|---|---|
| CN | 102386052 A | | 3/2012 |
| EP | 1172458 A2 | | 1/2002 |
| JP | 2003-51474 A | | 2/2003 |
| JP | 2003282510 A | | 10/2003 |
| JP | 2004186526 A | | 7/2004 |
| JP | 2004-249189 A | | 9/2004 |
| JP | 2005-116759 A | | 4/2005 |
| JP | 2005-138063 A | | 6/2005 |
| JP | 2005333015 A | * | 12/2005 |
| JP | 2005333015 A | | 12/2005 |
| JP | 2006-24692 A | | 1/2006 |
| JP | 2006-179913 A | | 7/2006 |
| JP | 2008-73611 A | | 4/2008 |
| JP | 2011-040572 A | | 2/2011 |
| JP | 2012503883 A | | 2/2012 |
| JP | 2012-124441 A | | 6/2012 |
| JP | 2012-204656 A | | 10/2012 |
| JP | 2013-26348 A | | 2/2013 |
| JP | 2013-105777 A | | 5/2013 |
| JP | 2013-179244 A | | 9/2013 |
| JP | 2014-241450 A | | 12/2014 |
| KR | 10-0171945 B1 | | 3/1999 |
| KR | 10-2005-0032943 A | | 4/2005 |
| KR | 10-0730348 B1 | | 6/2007 |
| KR | 10-2007-0113096 | | 11/2007 |
| KR | 10-2007-0113096 A | | 11/2007 |
| KR | 10-2008-0002633 | | 1/2008 |
| KR | 10-0822373 B1 | | 4/2008 |
| KR | 10-2013-0063761 | | 6/2013 |
| KR | 10-2014-0115795 A | | 10/2014 |
| TW | 201534407 A | | 9/2015 |
| WO | 2010/036575 A2 | | 4/2010 |
| WO | 2010090779 A2 | | 8/2010 |
| WO | 2011/103062 A2 | | 8/2011 |
| WO | 2012133583 A1 | | 10/2012 |

OTHER PUBLICATIONS

English Machine Translation of JP 2005-333015A.*
Office Action for Taiwan Application No. 107115524 dated May 29, 2019.
Search Report for Taiwan Application No. 107115524 dated May 29, 2019.
International Search Report & Written Opinion dated Mar. 17, 2014 for Application No. PCT/US2013/071314.
Office Action and Search Report for Chinese Application No. 201380057383X dated Dec. 20, 2016.
International Search Report an Written Opinion for International Application No. PCT/US2016/051341 dated Dec. 20, 2016.
International Search Report and Written Opinion of related application PCT/US2016/051480 dated Jan. 5, 2017.
International Search Report and Written Opinion of related application PCT/US2016/051520 dated Dec. 26, 2016.
International Search Report and Written Opinion for related application PCT/US2016/051582 dated Dec. 22, 2016.
International Search Report and Written Opinion, PCT/US2015/039974, dated Oct. 29, 2015.
Non-Final Rejection in related U.S. Appl. No. 14/078,373 dated Sep. 21, 2016.
Final Rejection in related U.S. Appl. No. 14/078,373 dated Apr. 13, 2017.
Taiwan Office Action in related application TW 102140520 dated Apr. 17, 2017.
OA in related application JP 2015-544135 dated May 23, 2017.
Japanese Office Action dated Mar. 13, 2018 for Application No. 2015-544135.
Office Action for Japanese Application No. 2018-176500 dated Sep. 3, 2019.

(56) References Cited

OTHER PUBLICATIONS

Taiwan Office Action dated Aug. 23, 2019, for Taiwan Patent Application No. 105131243.
Notice of Grant for Japanese Application No. 2018-176500 dated Feb. 4, 2020.
Fffice Action for Japanese Application No. 2018-546484 dated Oct. 8, 2019.
Search Report for Taiwan Application No. 108125950 dated Oct. 18, 2019.
Office Action for Japan Application No. 2018-517285 dated Oct. 23, 2019.
Notice of Allowance for Japan Application No. 2018-517344 dated Dec. 2, 2019.
Japanese Office Action issued to Japanese Application No. 2020-022247 dated Feb. 9, 2021.
Office Action for Chinese Application No. 201710840913.8 dated Jan. 13, 2021.
Search Report for Chinese Application No. 201710840913.8 dated Jan. 7, 2021.

* cited by examiner

STICTION-FREE DRYING PROCESS WITH CONTAMINANT REMOVAL FOR HIGH-ASPECT RATIO SEMICONDUCTOR DEVICE STRUCTURES

CROSS-REFERENCE TO RELATED APPLICATIONS

This application is a divisional of U.S. patent application Ser. No. 14/078,373, filed Nov. 12, 2013, which claims benefit of U.S. Provisional Patent Application Ser. No. 61/841,779, filed Jul. 1, 2013, and U.S. Provisional Patent Application Ser. No. 61/729,965, filed Nov. 26, 2012, which are herein incorporated by reference.

BACKGROUND

Field

Embodiments of the present disclosure generally relate to a method and apparatus for cleaning semiconductor substrates, and more specifically, to a stiction-free cleaning and/or drying process for high-aspect-ratio semiconductor device structures.

Description of the Related Art

In the cleaning of semiconductor devices, it is necessary to remove liquid and solid contaminants from surfaces of a substrate, thus leaving clean surfaces. Wet cleaning processes generally involve the use of cleaning liquids, such as aqueous cleaning solutions. After wet cleaning the substrate, it is necessary to remove the cleaning liquid from the surface of the substrate in a cleaning chamber.

Most current wet cleaning techniques utilize a liquid spraying or immersion step to clean the substrate. Drying of the substrate that has high aspect ratio features or low-k materials which have voids or pores is very challenging subsequent to the application of a cleaning liquid. Capillary forces of the cleaning liquid often cause deformation of materials in these structures which can create undesired stiction, which can damage the semiconductor substrate in addition to leaving residue on the substrate from the cleaning solution utilized. The aforementioned drawbacks are especially apparent on substrates with high-aspect-ratio semiconductor device structures during subsequent drying of the substrate. Line stiction, or line collapse, results from bending of the side walls, which form the high-aspect-ratio trench or via, towards each other due to capillary pressure across the liquid-air interface over the liquid trapped in the trench or via during the wet cleaning process(es). Features with narrow line width and high-aspect-ratios are especially susceptible to the difference in surface tension created between liquid-air and liquid-wall interfaces due to capillary pressure, which is also sometimes referred to as capillary force. Current workable drying practices are facing a steeply rising challenge in preventing line stiction as a result of rapid device scaling advancements.

As a result, there is a need in the art for drying processes which reduce or eliminate line stiction that can reduce the semiconductor device yield on a substrate.

SUMMARY

Embodiments provided herein generally relates to a method of cleaning a substrate and a substrate processing apparatus. More specifically, embodiments relate to a method of cleaning a substrate in a manner that reduces or eliminates the negative effects of line stiction between semiconductor device features. Other embodiments relate to a substrate processing apparatus that allows for cleaning of the substrate in a manner that reduces or eliminates line stiction between semiconductor device features.

In an embodiment, a method of cleaning a substrate includes exposing a substrate having high aspect ratio features formed thereon to a first solvent to remove an amount of a residual cleaning solution disposed on a surface of the substrate, exposing the surface of the substrate to a second solvent to remove the first solvent disposed on the surface of the substrate, exposing the surface of the substrate to a supercritical fluid to remove the second solvent disposed on the surface of the substrate, and exposing the surface of the substrate to electromagnetic energy.

In another embodiment, a method of cleaning a substrate includes exposing a substrate having high aspect ratio features formed thereon to a first solvent to remove an amount of a residual cleaning solution disposed on a surface of the substrate, exposing the surface of the substrate to a second solvent to remove the first solvent disposed on the surface of the substrate, exposing the surface of the substrate to a supercritical fluid to remove the second solvent disposed on the surface of the substrate, and exposing the surface of the substrate to electromagnetic energy after exposing the substrate to a supercritical fluid. Exposing the substrate to supercritical fluid can include transitioning a gas to a supercritical state to form the supercritical fluid, flowing the supercritical fluid over a surface of the substrate, and transitioning the supercritical fluid to a gaseous state.

In another embodiment, a method of cleaning a substrate includes exposing a substrate having high aspect ratio features formed thereon to a first solvent to remove an amount of a residual cleaning solution disposed on a surface of the substrate, exposing the surface of the substrate to a second solvent to remove the first solvent disposed on the surface of the substrate, exposing the surface of the substrate to a supercritical fluid to remove the second solvent disposed on the surface of the substrate, and exposing the surface of the substrate to a plasma and electromagnetic energy after exposing the substrate to a supercritical fluid. Exposing the substrate to supercritical fluid can include transitioning a gas to a supercritical state to form the supercritical fluid, flowing the supercritical fluid over a surface of the substrate, and transitioning the supercritical fluid to a gaseous state.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this present disclosure and are therefore not to be considered limiting of its scope, for the present disclosure may admit to other equally effective embodiments.

Figure 1:
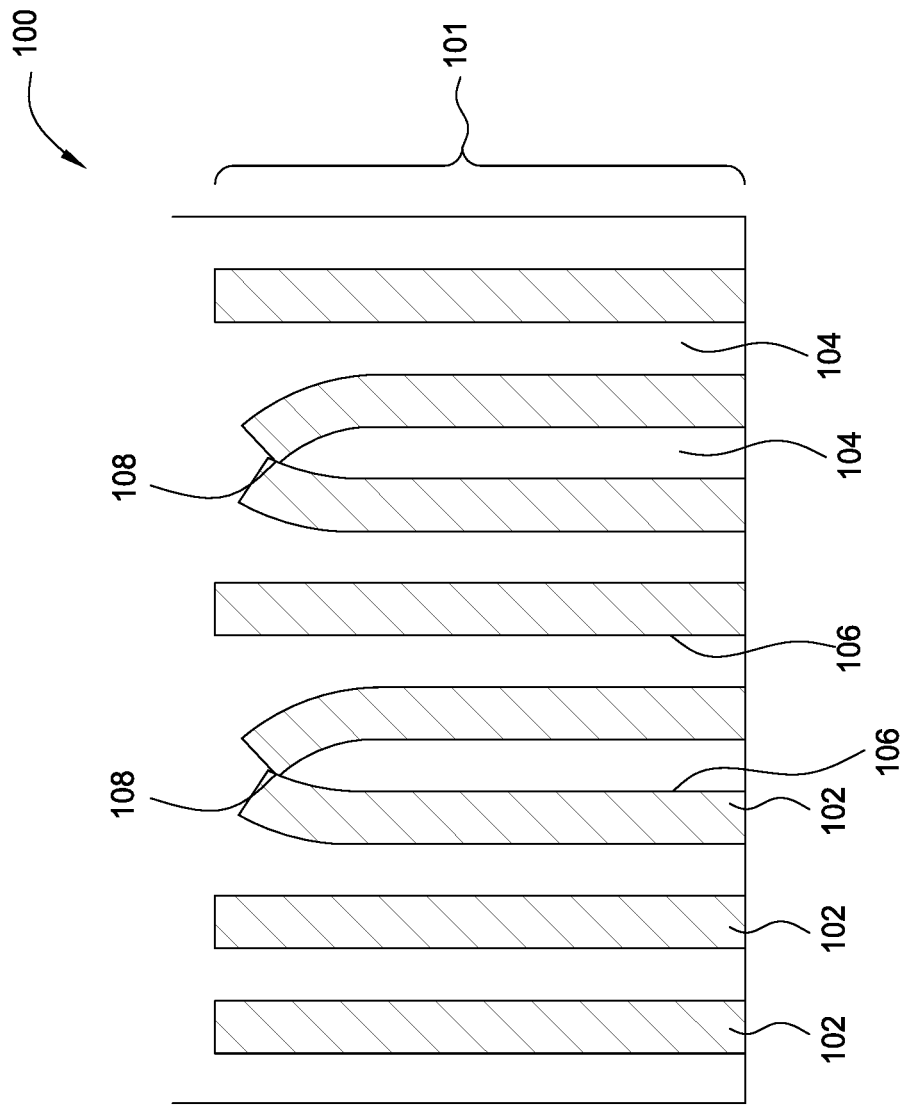
FIG. 1 illustrates the effect of stiction created between features formed within a semiconductor device structure formed on a substrate due to the creation of a capillary force during drying subsequent to a wet processing.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments provided herein generally relate to a method and apparatus used to clean a substrate. More specifically, embodiments relate to a method of cleaning a substrate in a manner that reduces or eliminates the line stiction created between semiconductor device features after a wet cleaning process has been performed on the substrate. Other embodiments relate to a substrate processing apparatus that allows for cleaning of the substrate in a manner that reduces or eliminates line stiction between semiconductor device features.

In the following description, for purposes of explanation, numerous specific details are set forth in order to provide a thorough understanding of the embodiments provided herein. However, it will be evident to one skilled in the art that the present disclosure may be practiced without these specific details. In other instances, specific apparatus structures have not been described so as not to obscure embodiments described. The following description and figures are illustrative of the embodiments and are not to be construed as limiting the present disclosure.

FIG. 1 is a schematic cross-sectional view that illustrates a portion of a semiconductor device 100 in which line stiction has occurred between two features within the semiconductor device 100. As shown, the high aspect ratio device structures are formed on a surface of a substrate. During processing, device structures 102 should remain in a vertical orientation and walls 106 should not cross the openings 104 and contact adjacent walls 106 of the device structures 102. When the semiconductor device 100 is being dried after being cleaned with wet chemistries, the walls 106 of the device structures 102 are subjected to capillary forces due to the air-liquid interface created by the cleaning liquid disposed within the opening 104, which causes the walls 106 of adjacent device structures 102 to bend towards one another and contact each other. Line stiction results from the contact between walls 106 of adjacent device structures 102, ultimately causing closure of the openings 104. Line stiction is generally undesirable because it prevents access to the openings 104 during subsequent substrate processing steps, such as further deposition steps.

To prevent line stiction, according to a method provided herein, a substrate may be exposed to an aqueous cleaning solution, such as de-ionized water or cleaning chemicals, in a wet clean chamber. Such a substrate includes a semiconductor substrate having electronic devices disposed or formed thereon. The use of the aqueous cleaning solutions on the substrate in a wet clean chamber removes residues left on the substrate after the wet cleaning processes have been performed. In some configurations, the wet clean chamber may be a single wafer cleaning chamber and/or a horizontal spinning chamber. Additionally, the wet clean chamber may have a megasonic plate adapted to generate acoustic energy directed onto the non-device side of the substrate.

Figure 6:
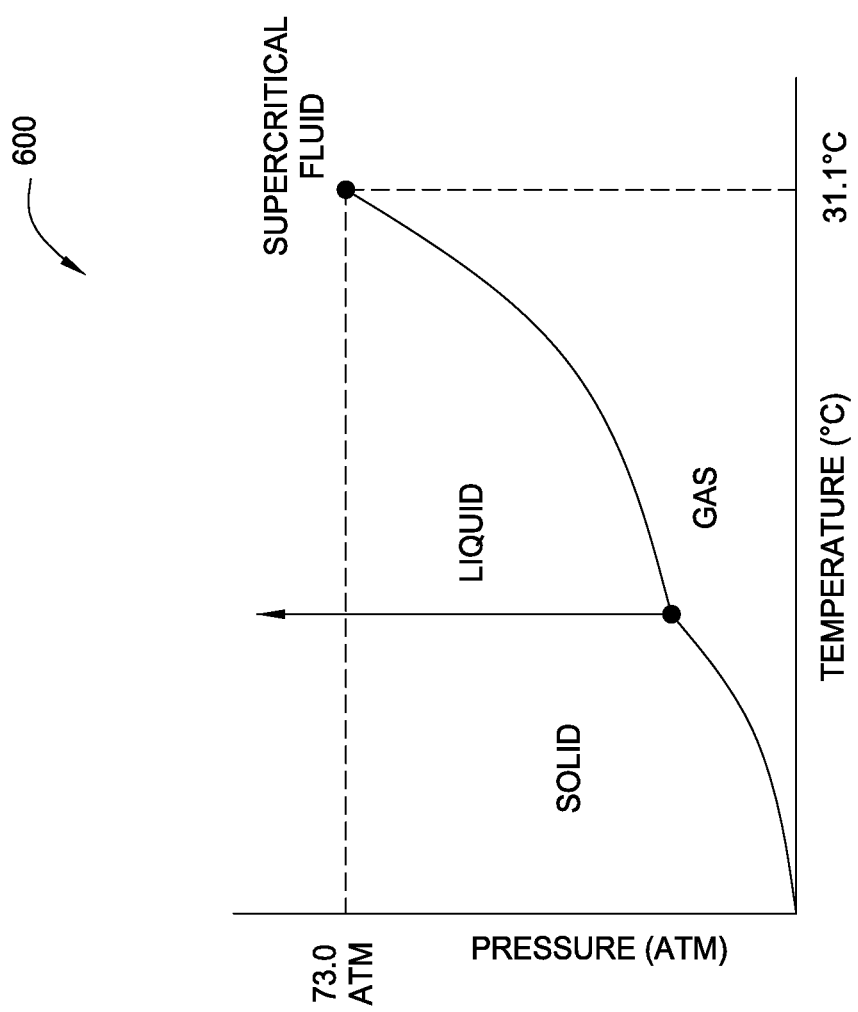
FIG. 6 illustrates a phase change diagram representative of $CO_2$.

After wet cleaning the substrate, the substrate may be transferred to a solvent exchange chamber to displace any previously used aqueous cleaning solutions used in the wet clean chamber. The substrate may then be transferred to a supercritical fluid chamber for further cleaning and drying steps to be performed on the substrate. In one embodiment, drying the substrate may involve the delivery of a supercritical fluid to a surface of the substrate. A drying gas may be selected to transition into a supercritical state when subjected to certain pressure and temperature configurations that are achieved or maintained in the supercritical processing chamber. One example of such a drying gas includes carbon dioxide ($CO_2$). Another example of a drying gas is propane ($C_3H_8$). FIG. 6 illustrates a phase change diagram for $CO_2$. Since supercritical $CO_2$ is a supercritical gas, it has no surface tension in that its surface tension is similar to a gas, but has densities that are similar to a liquid. FIG. 6 illustrates that supercritical $CO_2$ has a critical point at a pressure of about 73.0 atm and a temperature of about 31.1° C. One unique property of a supercritical fluid, such as $CO_2$, is that condensation will not occur at any pressure above the supercritical pressure and temperatures above the supercritical point (e.g., 31.1° C. and 73 atm for $CO_2$). The region to the right of the critical temperature and above critical pressure (e.g. 73 atm for $CO_2$) defines the supercritical state of the $CO_2$ drying gas.

The supercritical fluid, due to its unique properties, may penetrate substantially all pores or voids in the substrate and remove any remaining liquids or particles that may be present in the openings 104. In one embodiment, after the supercritical processing has proceeded for a desired period of time to remove particles and residues, the pressure of the chamber is decreased at a nearly constant temperature, allowing the supercritical fluid to transition directly to a gaseous phase within the openings 104. Liquids typically present in the openings 104 prior to supercritical fluid treatment may be displacement solvents from the solvent exchange chamber. Particles typically present in the openings 104 may be any solid particulate matter, such as organic species (i.e., carbon), inorganic species (i.e. silicon), and/or metals. Examples of openings 104 that may be dried by supercritical fluid include voids or pores in a dielectric layer, voids or pores in a low-k dielectric material, and other types of gaps in the substrate that may trap cleaning fluids and particles. Moreover, supercritical drying may prevent line stiction by bypassing the liquid state during phase transition and eliminating capillary forces created between the walls 106 of the device structures 102 due to the negligible surface tension of supercritical fluid, such as supercritical $CO_2$.

The substrate may then be transferred from the supercritical fluid chamber to a post processing chamber. The post processing chamber may be a plasma processing chamber, in which contaminants that may be present on the substrate may be removed. Post processing the substrate may also further release any line stiction present in the device structures. The processes described herein are useful for cleaning device structures having high aspect ratios, such as aspect ratios of about 10:1 or greater, 20:1 or greater, or 30:1 or greater. In certain embodiments, the processes described herein are especially useful for cleaning 3D/vertical NAND flash device structures.

Figure 2A:
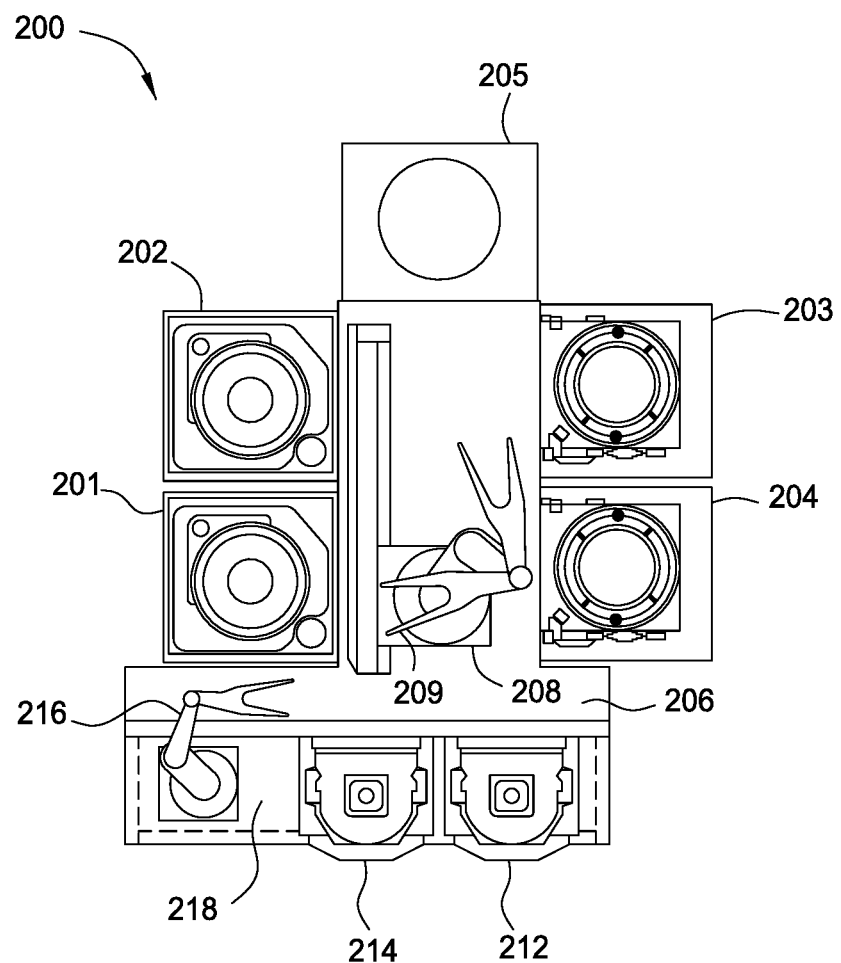
FIG. 2A illustrates a substrate processing apparatus according to certain embodiments provided herein.

FIG. 2A illustrates a substrate processing apparatus that may be adapted to perform one or more of the steps described above, according to one embodiment of the present disclosure. In one embodiment, the processing apparatus 200 comprises a wet clean chamber 201, a solvent exchange chamber 202, a supercritical fluid chamber 203, a post processing chamber 204, a transfer chamber 206, and a wet robot 208. Processing a substrate may include, but is not limited to, forming electrical devices such as transistors, capacitors, or resistors, that are interconnected by metal lines, which are insulated by interlayer dielectrics upon the substrate. These processes may include cleaning the substrate, cleaning films formed on the substrate, drying the substrate, and drying films formed on the substrate. In another embodiment, the processing apparatus 200 includes an inspection chamber 205, which may include tools (not shown) to inspect substrates that have been processed in the processing apparatus 200.

In one embodiment, the substrate processing apparatus 200 is a cluster tool comprising several substrate processing chambers, such as a wet clean chamber 201, a solvent exchange chamber 202, a supercritical fluid chamber 203, a post processing chamber 204, and a transfer chamber 206. The processing apparatus 200 may also comprise film deposition chambers (not shown) such as a chemical vapor deposition (CVD) chamber, an atomic layer deposition (ALD) chamber and/or a physical vapor deposition (PVD) chamber. The chambers may be positioned about the wet robot 208 which may be disposed in the transfer chamber 206. The wet robot 208 comprises a motor, a base, an arm, and an end effector 209 configured to transfer substrates between the chambers. Optionally, the wet robot 208 may have multiple arms and multiple end effectors to increase the throughput of the processing apparatus 200. In one embodiment, the wet robot 208 transfers substrates between the aforementioned chambers. In another embodiment, at least one of the end effectors of the wet robot 208 is a dedicated dry end effector (e.g., adapted to handle dry wafers) and at least one of the end effectors of the wet robot 208 is a dedicated wet end effector (e.g., adapted to handle wet wafers). The dedicated dry end effector may be used to transfer substrates between the supercritical fluid chamber 203 and the post processing chamber 204. The processing apparatus 200 also comprises a dry robot 216 disposed in a factory interface 218 which may be coupled to the processing apparatus 200 and a plurality of substrate cassettes 212 and 214, each holding a plurality of substrates to be cleaned or dried, or that have been cleaned or dried. The dry robot 216 may be configured to transfer substrates between the cassettes 212 and 214 and the wet clean chamber 201 and post processing chamber 204. In another embodiment, the dry robot 216 may be configured to transfer substrates between the supercritical fluid chamber 203 and the post processing chamber 204. The processing chambers within the processing apparatus 200 may be placed on a horizontal platform which houses the substrate transfer chamber 206.

Figure 2B:
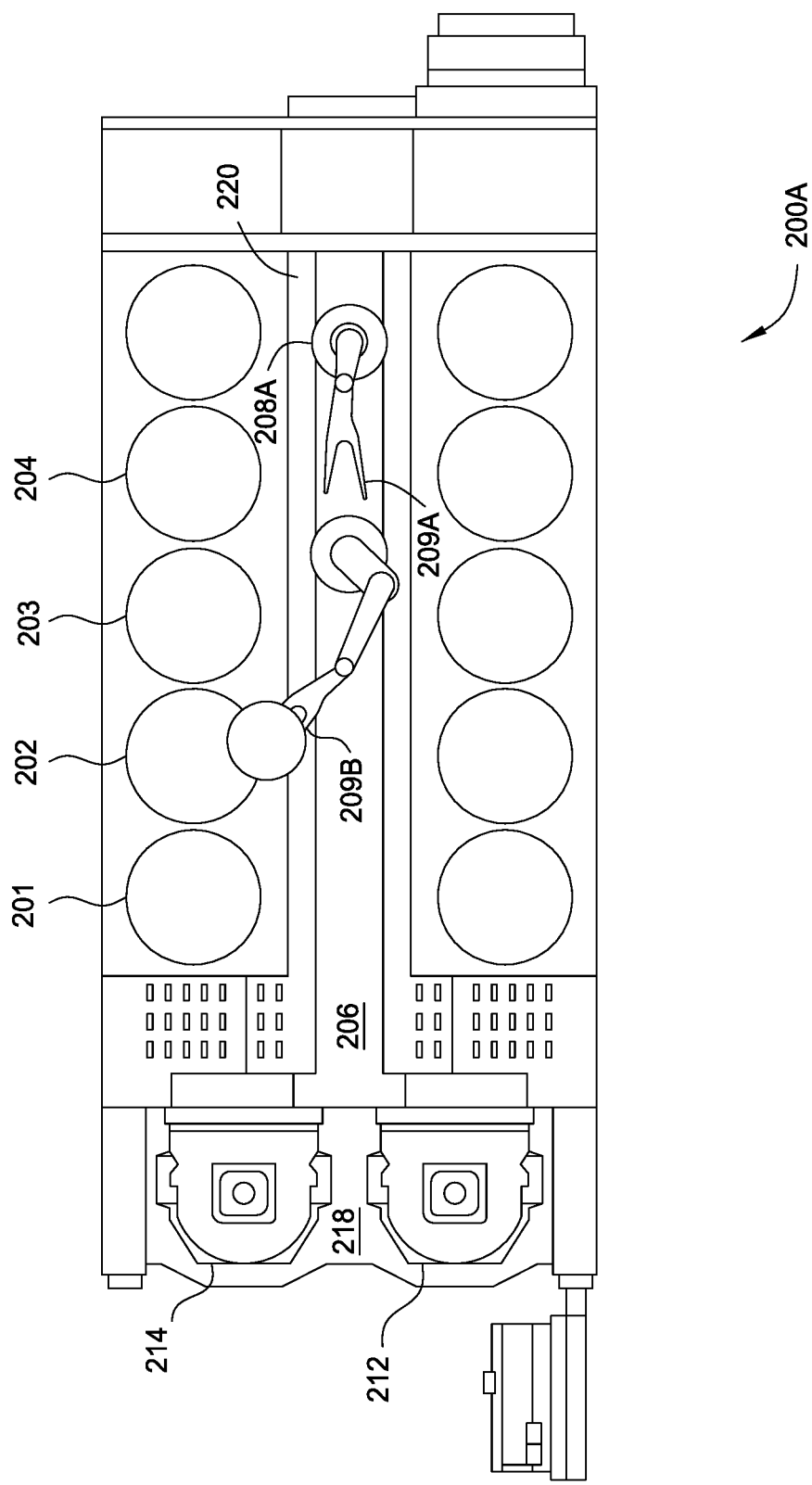
FIG. 2B illustrates a substrate processing apparatus according to certain embodiments provided herein.

In an alternate embodiment, as shown in FIG. 2B, the processing apparatus 200A may be a linear apparatus comprising several substrate processing chambers such as a wet clean chamber 201, a solvent exchange chamber 202, a supercritical fluid chamber 203, a post processing chamber 204, and a transfer chamber 206. For example, the processing apparatus 200A may be the Raider® GT available from Applied Materials, Santa Clara, Calif., however it is contemplated that other processing apparatuses from other manufacturers may be adapted to perform the embodiments described herein. The processing apparatus 200A may also comprise film deposition chambers (not shown) such as a CVD chamber, an ALD chamber and/or a PVD chamber. The chambers may be positioned about a robot 208A which may be disposed in the transfer chamber 206. The robot 208A comprises a motor, a base, an arm, and end effectors 209A and 209B configured to transfer substrates between the chambers. The robot 208A may have multiple arms and multiple end effectors to increase the throughput of the processing apparatus 200A. In one embodiment, the robot 208A, having a dedicated wet end effector 209A, transfers substrates between the aforementioned chambers. The processing apparatus 200A may also comprise a factory interface 218 which may be coupled to the processing apparatus 200A and a plurality of substrate cassettes 212 and 214, each holding a plurality of substrates to be cleaned or dried, or that have been cleaned or dried. The robot 208A having the dedicated dry end effector 209B, transfers substrates between the cassettes 212 and 214 and the wet clean chamber 201 and post processing chamber 204. In one embodiment, the dedicated dry end effector 209B may be configured to transfer substrates between the supercritical fluid chamber 203 and the post processing chamber 204. The chambers within the processing apparatus 200A may be placed on a horizontal platform which houses the substrate transfer chamber 206.

In some configurations of the processing apparatus 200A, the robot 208A may travel along a linear track 220. Chambers may be arranged in sequence on one or both sides of the linear track 220. To perform wet substrate transfer, excess liquid may be removed from the substrate, such as by rotating the substrate, while still in the chamber so only a thin wet layer remains on the substrate surface before the robot 208A transfers the substrate. In embodiments providing two or more end effectors on the robot 208A, at least one may be dedicated to wet substrate transfer and the other one may be dedicated to dry substrate transfer. More chambers may be installed in the extendable linear configuration for high-volume production.

The configurations referred to in the previous embodiments greatly reduce design complexities of each chamber, enable queue time control between sensitive process steps, and optimize throughput in continuous production with adjustable chamber module count to equalize process duration of each key step.

Referring back to FIG. 2A, the cleaning and drying processes of the processing apparatus 200 proceed in a sequence timed to optimize throughput by the use of available chamber space and the wet robot 208. One possible processing sequence for cleaning and drying substrates that have film(s) formed thereon includes: the dry robot 216 takes an unclean substrate from a substrate cassette 212 or 214 and installs the substrate in the wet clean chamber 201, the wet robot 208 removes the substrate from the wet clean chamber 201 and installs the substrate in the solvent exchange chamber 202, the wet robot 208 removes the substrate from the solvent exchange chamber 202 and installs the substrate in the supercritical fluid chamber 203, the dry robot 216, or the dedicated dry end effector of the wet robot 208, removes the substrate from the supercritical fluid chamber 203 and places it in the post processing chamber 204, and the dry robot 216 removes the substrate from the post processing chamber 204 and deposits the cleaned and dried substrate into one of the substrate cassettes 212 or 214. The movement of the substrate in the processing apparatus 200 may optimize substrate cleaning and drying times. Other sequence variations may be used to select an optimal substrate cleaning and drying cycle time.

In one embodiment, a substrate may be initially processed in a pre-processing chamber disposed in a processing apparatus (e.g., processing apparatus 200), such as a film deposition chamber (not shown) to form a film or films on the substrate or a film etching chamber that may remove material from the substrate. The cassettes 212 and 214 may deliver the substrate to the processing apparatus 200 and the substrate may then be placed in a first processing chamber, such as the wet clean chamber 201, by a robot. In this configuration, the robot delivers the substrates to the first processing chamber from one of the cassettes 212 and 214. The substrate may then be exposed to a cleaning solution to remove contaminants, such as material residues/particles or liquids present on the substrate, in the wet clean chamber 201. In one embodiment, the cleaning solution may comprise deionized water, cleaning solvents, or a combination thereof.

Next, the substrate may be transferred by the wet robot 208 from the wet clean chamber 201 to the solvent exchange chamber 202. In the solvent exchange chamber 202, the previously disposed cleaning solution may be displaced by a solvent by exposing the substrate to a solvent. In one embodiment, the solvent used to displace the cleaning solution may be a single chemical, which may be in either a liquid or a supercritical phase, or a sequence of various chemicals or mixtures thereof in a liquid or supercritical phase. The condition and phase of the chemicals or mixtures for displacement may be determined by the relative solubility, miscibility, and liquid displacement characteristics among the deionized water, solvents, and the chemicals or mixtures thereof chosen.

In one embodiment, the substrate may be exposed to the solvent to displace residual liquid remaining on the substrate. The solvent may be provided to a top surface of the substrate in a sufficient amount to displace substantially all of the liquid remaining on the surface of the substrate from the prior processing step. The solvent exchange may be performed by a fill and purge process. For example, a solvent(s), such as those described above, may be introduced to the solvent exchange chamber 202 and the solvent exchange chamber 202 may be filled with the solvent to at least cover the substrate. After the solvent exchange has proceeded for a desired amount of time, the chamber may be purged by removing the solvent(s) from the solvent exchange chamber 202.

In one embodiment, suitable solvents for the solvent exchange include acetone, isopropyl alcohol, ethanol, methanol and other non-polar solvents. It is believed that by removing water and exchanging it with a solvent soluble in the supercritical fluid, the subsequent supercritical flushing and drying may be improved due to the prevention of phase separation between the solvent and the supercritical fluid during its removal.

In another embodiment, suitable solvents for the solvent exchange process include N-Methyl-2-pyrrolidone, N-Methylformamide, 1,3-Dimethyl-2-imidazolidinone, dimethylacetamide, and dimethyl sulfoxide. These polar solvents, such as organic polar solvents, displace water and it is generally desirable that the solvents possess a high dielectric constant (greater than 30) and a low evaporation rate (less than 0.5 relative to n-Butyl Acetate). The organic polar solvents may also generally be miscible in water and suppress precipitation of silica particles from the silicon-water reaction.

In one embodiment, the solvent exchange process comprises providing a plurality of solvents to the substrate sequentially to displace the residual remaining liquid on the substrate surface. In one embodiment of the process sequence, a multiple step solvent exchange process may be performed by delivering a polar solvent and then a non-polar solvent to the surface of the substrate to remove the residual liquid. In one example, the process sequence includes providing a first solvent that comprises a polar solvent that is configured to displace deionized water from the substrate, and then a second solvent that comprises a non-polar solvent, such as about 90 percent or greater liquid isopropyl alcohol (IPA), which may be utilized at room temperature to displace the polar solvent on the substrate in the solvent exchange chamber 202. Use of a polar solvent may be effective in helping to remove any residual particles, which is important before providing a non-polar solvent, such as IPA, to the substrate surface. Use of a polar and subsequent non-polar solvent is believed to more effectively remove the residual liquid and any residual particles or similar contaminants from the substrate.

However, due to the structure of most polar solvents, after the polar solvent has displaced the cleaning fluid (i.e., aqueous solution), the polar solvent, such as an organic polar solvent which has a low solubility in supercritical $CO_2$, needs to be replaced with a non-polar solvent to assure that the polar solvent may be easily removed from the surface of the substrate during the subsequent process steps. After a non-polar solvent, such as IPA, has displaced the organic polar solvent, the subsequent displacement of the non-polar solvent with supercritical fluids (e.g., super critical $CO_2$) may be performed. In a preferred embodiment, the organic polar solvents comprise N-Methyl-2-pyrrolidone or N-Methylformamide, or combinations thereof. Therefore, in one example, the solvent exchange process may comprise displacing the cleaning solution with an organic polar solvent, and then displacing the organic polar solvent with a non-polar organic solvent.

Next, a phase transition process may be performed to prepare the substrate for subsequent supercritical cleaning and drying processes. The phase change process may proceed in one of two manners, or a combination thereof. In one embodiment, after displacement of the residual material on the surface of the substrate with a solvent, such as a non-polar solvent, has been performed, the solvent may be directly displaced with a supercritical fluid, such as pure supercritical $CO_2$ or $C_3H_8$. In this embodiment, pure supercritical fluid may be provided to the supercritical fluid chamber 203. Accordingly, the temperature and pressure maintained in the supercritical fluid chamber 203 may be adjusted to maintain the fluid in a supercritical state. In another embodiment, if the chemicals or chemical mixtures used in the aforementioned displacement process are liquid, such as liquid $CO_2$, and may be transitioned to a supercritical phase, a phase transition process may be used to convert the chemicals or chemical mixtures to a supercritical fluid. For example, 90 percent or greater liquid IPA may be displaced by liquid $CO_2$ at about 5-8° C. and about 50 bar. In one embodiment, the about 5-8° C. and about 50 bar liquid $CO_2$ described above may be heated to about 40° C. and a pressure of about 95 bar in the supercritical fluid chamber 203. As a result of the creation of the supercritical phase, capillary pressure due to the difference between liquid-gas and liquid-solid surface tension is eliminated. The elimination of capillary pressure prevents bending and interaction of the clean surfaces, which may reduce the probability of stiction from occurring in the high-aspect-ratio features.

In one embodiment, supercritical fluid comprising the same types of chemicals or chemical mixtures as previously described may be formed and introduced to the supercritical fluid chamber 203 to clean and flush away particles and residues remaining on the surface of the substrate in a supercritical flushing process. In one embodiment, $CO_2$ may be used to form a supercritical fluid. The supercritical $CO_2$ may be formed outside the supercritical fluid chamber 203 and then introduced to the supercritical fluid chamber 203. In one embodiment, supercritical $CO_2$ at a point above the supercritical point, such as about 40° C. and about 95 bar, may be formed outside the supercritical fluid chamber 203 and then introduced to the supercritical fluid chamber 203.

In another embodiment, liquid $CO_2$ may be provided to the chamber and subsequently converted to supercritical $CO_2$ by increasing the temperature and pressure in the chamber. In this embodiment, liquid $CO_2$ is provided to the supercritical fluid chamber 203 at a first rate, wherein the first rate is configured to avoid disturbing solvent present on the surface of the substrate. After a desired amount of liquid $CO_2$ has been provided to the supercritical fluid chamber 203, more liquid $CO_2$ is provided to the supercritical fluid chamber 203 at a second rate greater than the first rate until the supercritical fluid chamber 203 has been substantially filled with liquid $CO_2$. The second rate is configured to create a turbulent flow to encourage interaction between the solvent on the substrate and the liquid $CO_2$. It is believed that causing the interaction of liquid $CO_2$ with the solvent material, versus a supercritical $CO_2$ fluid, greatly improves the process of displacement and removal of the solvent material from the surface of the substrate. Various apparatuses, such as a showerhead or angled passages in the chamber wall(s), may be used in combination with the increased flow at a second rate to enhance turbulence and interaction of the liquid $CO_2$ with the surfaces of the substrate disposed within the supercritical fluid chamber 203.

In both embodiments, the supercritical $CO_2$ exhibits properties intermediate between a gas and a liquid and has the ability to penetrate well into intricate nano-geometries, due to its gas-like transport behaviors, which can be effective in particle and residue removal due to its excellent mass-transfer capabilities commonly associated with flowing liquids. In one embodiment, the supercritical flushing process may proceed for about 30 seconds to about 60 seconds.

The supercritical flushing process may be achieved in several different manners. In one embodiment, the supercritical fluid may be introduced into a volume above the substrate in the chamber 203 and allowed to stagnate. In one example, pure supercritical $CO_2$ above the surface of the substrate creates a concentration gradient between the volume above the substrate, where pure supercritical $CO_2$ exists, and the surface of the substrate where solvent, residues, and particles may exist. It is believed that the solvents, residues, and particles are drawn by diffusion from the high-aspect ratio features on the surface of the substrate to the volume of $CO_2$ above the substrate due to the desire of fluids to exist in thermodynamic equilibrium.

In another embodiment, supercritical flushing may be performed by mechanically flowing the supercritical fluid through the chamber 203. The supercritical fluid may be delivered with sufficient flow across the surface of the substrate to cause the flowing supercritical fluid to penetrate the high-aspect-ratio features on the surface of the substrate and flush away solvents, residues, and particles that may be present in the high-aspect ratio features. In some embodiments, the mechanical flow may also work in concert with periods of stagnant fluid (e.g., $CO_2$) present in the chamber 203 to improve the flushing process. In this example, sequences of periods of mechanical flow across the substrate surface and then periods where the flow is stagnant may be used to improve the supercritical flushing process and reduce the amount of supercritical fluid, such as supercritical $CO_2$, that may need to be reclaimed or exhausted.

Next, the substrate may be subjected to a supercritical drying process. This process may be controlled by adjusting the temperature and pressure within the chamber 203 to ensure a phase transfer of the chemicals or chemical mixtures from a supercritical to a gaseous state without entering a liquid state. FIG. 6 depicts the possible $CO_2$ phases at relative temperatures and pressures. The process ensures the supercritical fluid (area beyond the dashed line) changes to a gaseous state without turning into a liquid, for example by crossing over the line separating the liquid and gaseous phases as shown in FIG. 6. The fluids expelled from the high-aspect-ratio trenches during the supercritical drying process may exhibit a negligible surface tension due to the characteristics of the supercritical fluid which results in the reduction or elimination of line stiction. In one embodiment, the supercritical $CO_2$ at about 40° C. and about 95 bar undergoes isothermal depressurization at about 40° C. until the pressure drops to about 21 bar. In one embodiment, the gasses remaining in the supercritical fluid chamber 203 may be vented from the chamber to an exhaust area.

The substrate may then be transferred from the supercritical fluid chamber 203 by the robot 208 to the post processing chamber 204. The substrate may be post processed in the post processing chamber 204 by exposing the substrate to plasma at a low power for final treatment to complete the drying stiction removal process. The post processing may un-stick any collapsed trenches and/or passivate the surfaces of the substrate. In one embodiment, oxygen ($O_2$) or halogen gas plasma may be applied to the substrate by exposing the gas in the chamber to about 75 W of RF energy to form a plasma over the surface of the substrate for about 10 seconds. In another embodiment, the RF plasma formed in the post processing chamber 204 may comprise a fluorocarbon, such as $C_2F_6$ or $CF_4$. The post processing of the substrate may release minor or temporary stictions, if any, caused by local impurities created by the chemicals or chemical mixtures that were used in previous cleaning processes. The post processing may further release minor or temporary stictions caused by atomic interactions between the cleaned surfaces of device features, such as atomic orbital overlap, Van der Waal's forces, or the presence of dangling bonds in adjacent device features in high energy states that bond with each other to achieve a more stable, lower energy state.

The post processing may be most effective if implemented immediately after the supercritical drying process because the impurities or atomic interactions, as described above, have not had time to "set" or become more permanent. The post processing implemented immediately after the supercritical drying step may even prevent clean surface atomic interactions, such as dangling bonds from rearranging into lower energy states before the atoms transfer or share electrons to bond in stable, lower energy states. In another embodiment, any organic contaminations remaining on the substrate may be removed with exposure to biased plasma.

Figure 3A:
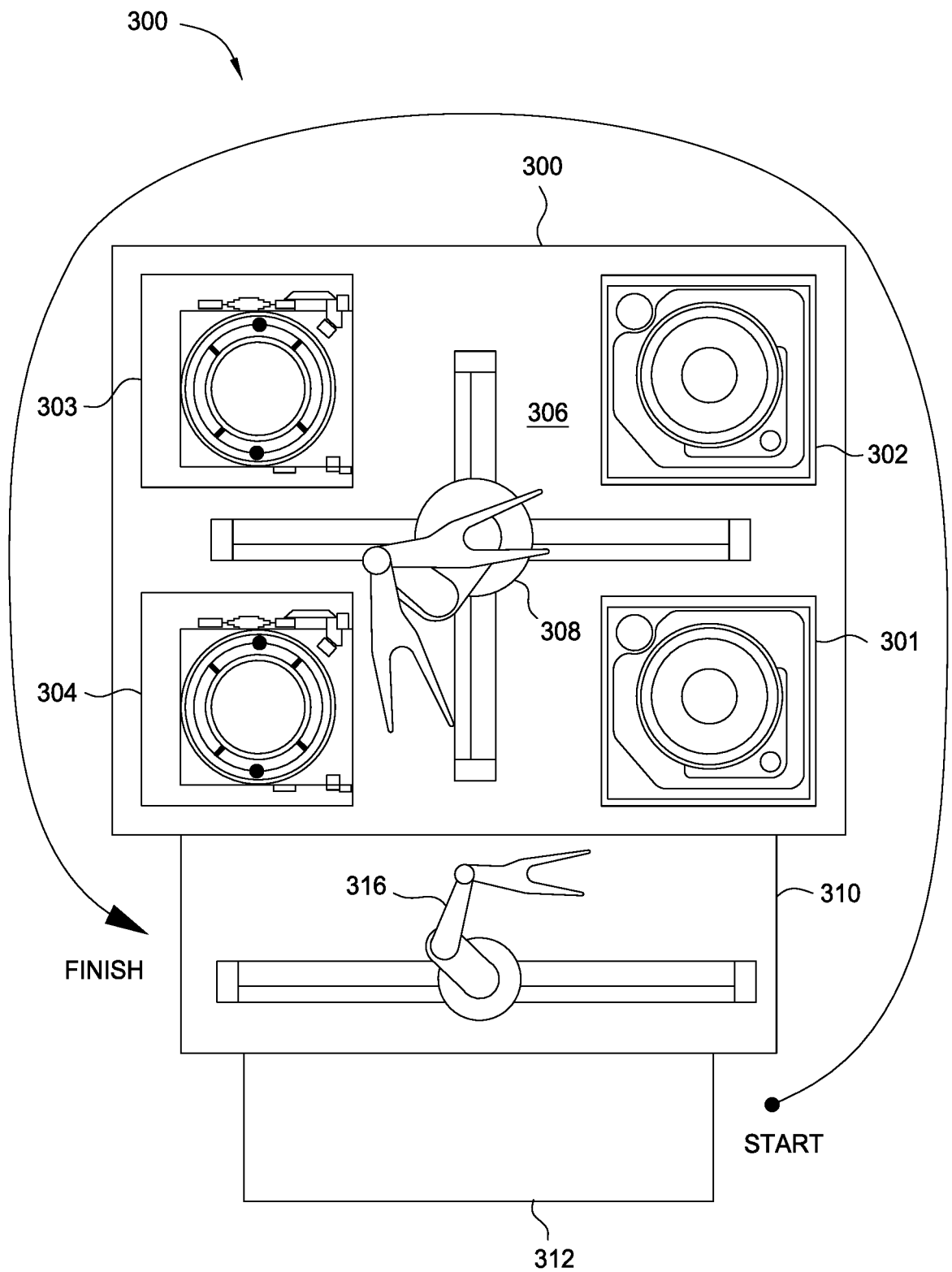
FIG. 3A illustrates the substrate process flow in a processing apparatus according to certain embodiments provided herein.

FIG. 3A illustrates the substrate processing sequence according to one embodiment. The processing apparatus 300 comprises multiple chambers, such as a wet clean chamber 301, a solvent exchange chamber 302, a supercritical fluid chamber 303, and a plasma processing chamber 304 similar to those previously described in conjunction with FIGS. 2A-2B. The substrate processing sequence proceeds through the processing apparatus 300 as subsequently described with reference to the method of FIG. 8. The processing apparatus of FIG. 3 may further comprise a dry robot 316 disposed in a factory interface 310. The dry robot 316 may be similar to the wet robot 308 disposed in the transfer chamber 306 of the processing apparatus 300. The dry robot 316 may be configured to transfer substrates to and from the cassette(s) to the processing apparatus 300. In one embodiment, the dry robot 316 may be configured to transfer substrates from the cassette(s) 312 through the factory interface 310 and to the wet clean chamber 301. An end effector of the dry robot 316 may remove an unclean substrate from a cassette and transfers the unclean substrate to the wet clean chamber 301 where the dry robot 316 may deliver the unclean substrate to the interior of the wet clean chamber 301. The dry robot 316 may also configured to transfer substrates from the supercritical fluid chamber 303 to the plasma processing chamber 304 and from the plasma processing chamber 304 through the factory interface 310 to the cassette(s) 312. The end effector of the dry robot 316 may remove a clean substrate from the interior of the plasma processing chamber 304 and deliver the clean substrate to a cassette 312. It should be acknowledged that multiple arrangements of the chambers in the processing apparatus 300 may be possible while still practicing the present disclosure.

Figure 3B:
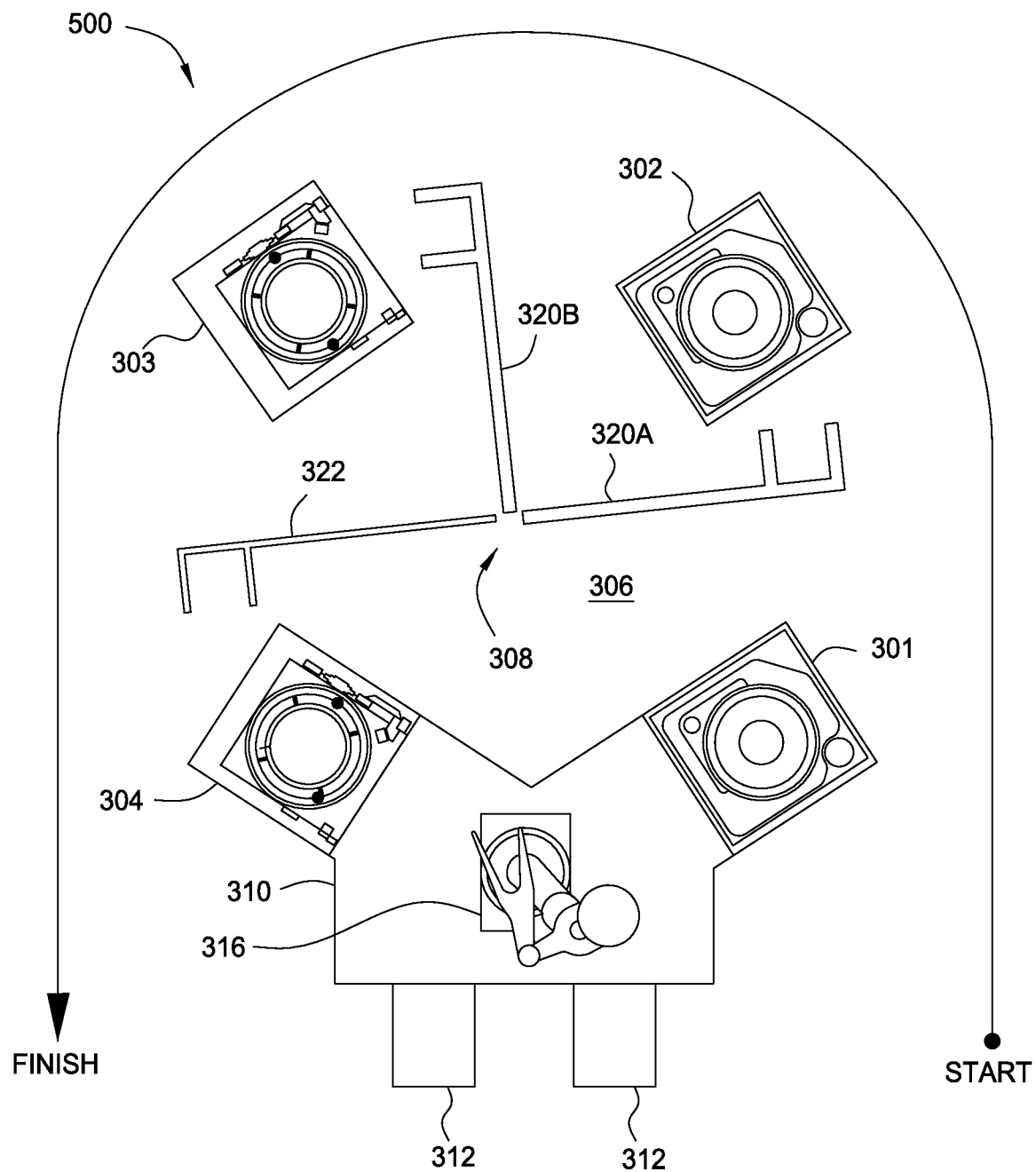
FIG. 3B illustrates the substrate process flow in a processing apparatus according to certain embodiments provided herein.

FIG. 3B illustrates the substrate process flow according to another embodiment. The processing apparatus 300 may be similar to the processing apparatus of FIG. 3A. In one embodiment, the wet robot 308 may comprise a plurality of end effectors 320A, 320B, and 322 disposed in the transfer chamber 306, which may transfer substrates between the various processing chambers.

In one embodiment, end effectors 320A and 320B may be dedicated for wet processing transfer steps. For example, a substrate may be processed in the wet clean chamber 301 or the solvent exchange chamber 302 and a thin film of liquid may remain on the surface of the substrate to protect the surface of the substrate during transfer and to keep the substrate from drying out, thus reducing any variation in queue time from one substrate to another. The wet processing end effectors 320A and 320B may be dedicated to transferring substrates between only two chambers, respectively, to prevent contamination of the substrate during subsequent processing steps. Wet processing end effector 320A may transfer substrates from the wet clean chamber 301 to the solvent exchange chamber 302. The wet processing end effector 320A travels in a path between the wet clean chamber 301, where the wet processing end effector 320A may remove a substrate from the wet clean chamber 301, and the solvent exchange chamber 302, where the wet processing end effector 320A inserts the substrate into the solvent exchange chamber 302. The wet processing end effector 320A may return along the same path and repeat the process for each new substrate that has been processed in the wet clean chamber 301.

In one embodiment, wet processing end effector 320B is similar to wet processing end effector 320A. However, wet processing end effector 320B may transfer substrates from the solvent exchange chamber 302 to the supercritical fluid chamber 303. The wet processing end effector 320B may travel in a path between the solvent exchange chamber 302 and the supercritical fluid chamber 303. During operation, the wet processing end effector 320B may remove a substrate from the solvent exchange chamber 302, transfer the substrate to the supercritical fluid chamber 303, and insert the substrate into the supercritical fluid chamber 303. In one configuration, the wet processing end effector 320B may return along the same path and repeat the process for each new substrate that has been processed in the solvent exchange chamber 302.

In another embodiment, the wet robot further comprises a dry processing end effector 322. The dry processing end effector 322 may be dedicated to substrate transfer between the supercritical fluid chamber 303 and the plasma chamber 304. The dry processing end effector 322 may travel in a path between the supercritical fluid chamber 303 and the plasma chamber 304. During operation, the dry processing end effector 322 may remove a substrate from the supercritical fluid chamber 303 and transfer the substrate to the plasma chamber 304, where the dry processing end effector 322 inserts the substrate into the plasma chamber 304. In one configuration, the dry processing end effector 322 may return along the same path and repeat the process for each new substrate that has been processes in the supercritical fluid chamber 303.

Figure 4A:
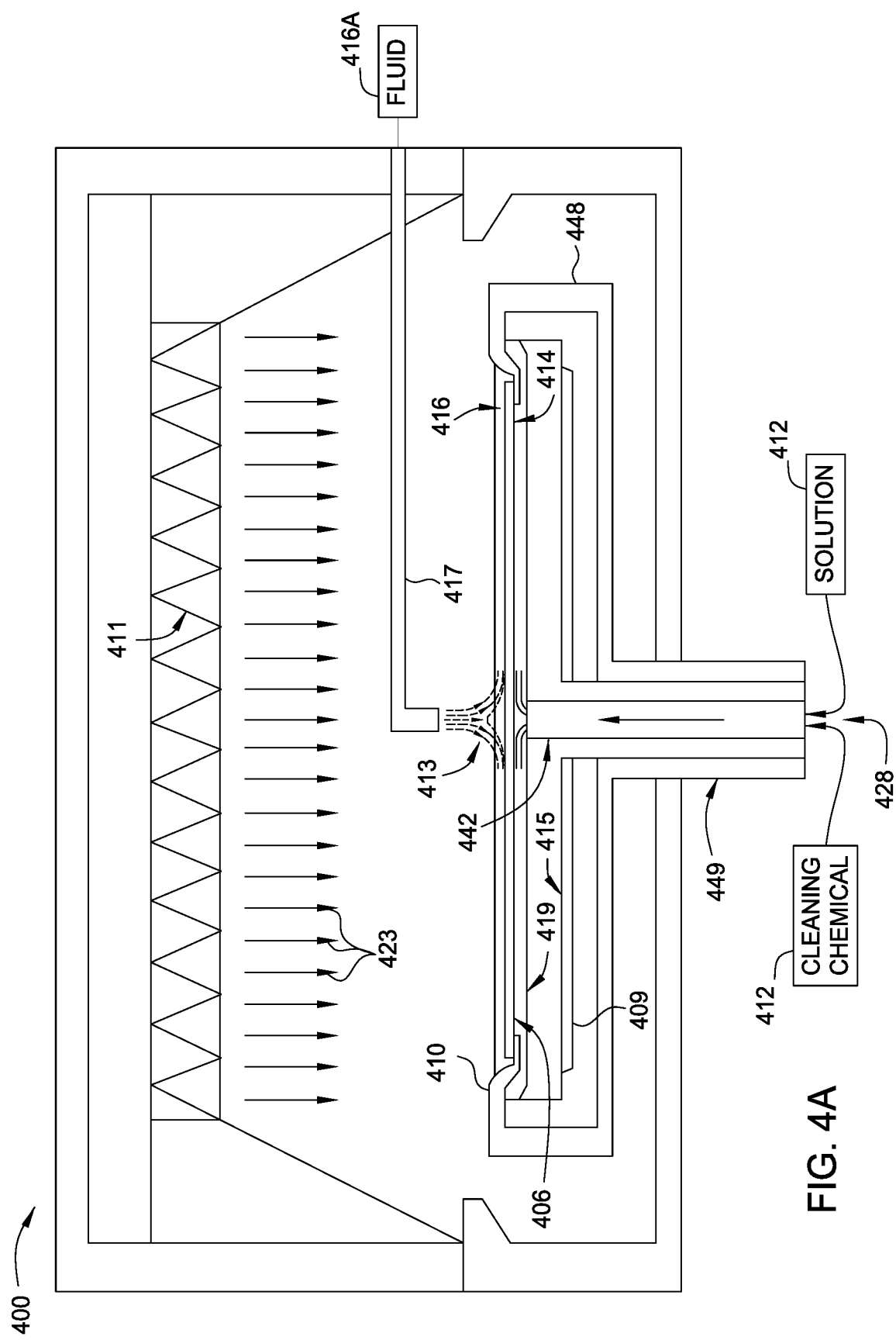
FIG. 4A illustrates a cross-sectional view of a wet processing chamber according to certain embodiments provided herein.

FIG. 4A illustrates a cross-sectional view of a wet processing chamber according to one embodiment. It is contemplated that the wet processing chamber, depicted in FIG. 4A, may be utilized as the wet clean chamber 201 and/or as the solvent exchange chamber 202. In one embodiment, the wet processing chamber 400 may be a single substrate processing chamber. In one embodiment, the bottom side of the substrate 406 (substrate bottom surface 414) may be exposed to cleaning, rinsing, and drying solutions 412, while the top side of the substrate 406 (substrate top surface 416) may not exposed to any solutions. The substrate bottom surface 414 (which could be the substrate non-device side) may be facing down to be exposed to solutions 412. In another embodiment, both the substrate top surface 416 and the substrate bottom surface 414 may be exposed to one or more cleaning or solvent exchange solutions.

In one embodiment, the chamber 400 includes a rotatable substrate holding bracket (bracket) 448, which translates along an axis of rotation device 449. The rotation device 449 may further be coupled to an electronic motor (not shown)

which may rotate the bracket 448. The chamber 400 also includes an access door (not shown) through which a robot arm (not shown) holding the substrate 406 may enter to place the substrate in the bracket 448. In one embodiment, the substrate 406, when positioned in the bracket 448, may rest on support clips 410 and a vertical support post included in the bracket 448. The bracket 448, together with the support posts, may raise or lower the substrate to a desirable position.

In one embodiment, the bracket 448 may rotate the substrate 406 while solutions are dispensed from below during a cleaning cycle. In another embodiment, the bracket 448 may rotate the substrate 406 while solutions 412 are dispensed from another nozzle on the top and/or the bottom surface of the substrate 406 during a processing cycle, such as a cleaning cycle. In another embodiment, the bracket 448 may rotate the substrate 406 in a horizontal plane during cleaning.

In one embodiment, the chamber 400 also includes a tube 428 connected to a through hole (feed port) 442. During a cleaning cycle, cleaning fluids or chemicals may be introduced through the tube 428 from a cleaning chemical source 428A. As a result of substrate 406 rotation (spin), the solution 412 may be applied to the substrate bottom surface 414. A nozzle located above the substrate 406 may dispense solutions to the top surface 416 of the substrate 406 from a fluid source 416A. The residues and/or liquids present on the substrate 406 that need to be cleaned off are removed as the substrate 406 is rotated at high speed.

In another embodiment, the chamber 400 further includes a filter 411 such as a High Efficiency Particulate Arresting (HEPA) filter or an Ultra Low Penetration Air (ULPA) filter. A downward flow of air 423 from the filter 411 and gravity may act to maintain the substrate 406 positioned to the vertical support posts.

In another embodiment, the chamber 400 may also include other nozzles (not shown) that allow a solution to be delivered to the substrate top surface 416. Thus, a first group of solutions may be transferred to the substrate bottom surface 414 while solutions from a different source (a second group of solutions) may be transferred to a substrate top surface 416. Solutions that can be applied to either surface of the substrate may include water or other cleaning solutions, such as solvents which may comprise acetone, isopropyl alcohol, ethanol, methanol, and may further comprise organic polar solvents such as formic acid, N-Methyl-2-pyrrolidone, N-Methylformamide, 1,3-Dimethyl-2-imidazolidinone, dimethylacetamide, and dimethyl sulfoxide, or sequences, combinations, and mixtures thereof. Other solvents comprising three or fewer carbon atoms may also be utilized in various embodiments. The solvents utilized may be miscible in $CO_2$ and/or may be solvated when contacted by at least liquid $CO_2$ or supercritical $CO_2$.

In another embodiment, the chamber may be used to spin dry the substrate 406 after each wet cleaning cycle. For example, after a wet cleaning cycle, the rotating device 449 continues to rotate the bracket 448, thus spinning the substrate 406. The spinning of the substrate 406 removes the liquids (or reagents) that are used to clean the substrate 406. In another embodiment, the wet processing chamber 400 may be utilized as a solvent exchange chamber which may introduce a solvent, such as an organic polar solvent and/or a non-polar solvent, through the tube 428 to facilitate solvent exchange within the cleaning fluids trapped in the features formed on the substrate 406.

Figure 4B:
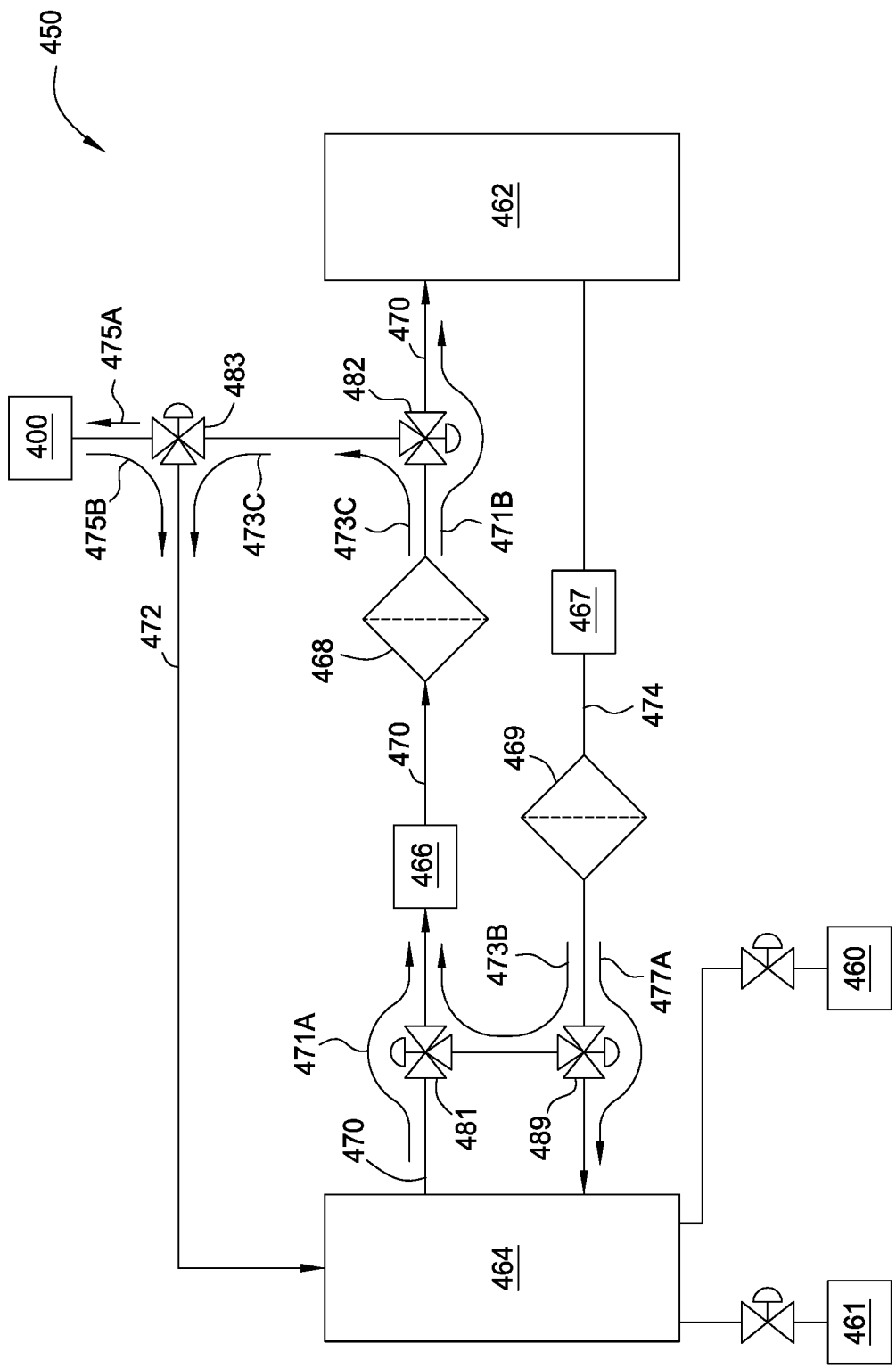
FIG. 4B illustrates a schematic view of a solvent filtration system according to certain embodiments provided herein.

FIG. 4B is a schematic illustration of a solvent filtration system 450 according to certain embodiments described herein. For example, the solvent filtration system 450 may be utilized in combination with the wet processing chamber 400 during a solvent exchange process. The solvent filtration system 450 comprises a fluid source 460, a fluid drain 461, a first tank 462, a second tank 464, a first pump 466, a first filter 468, a second pump 467 and a second filter 469. The filtration system 450 may include a first recirculation path 470, a second recirculation path 472, and a third recirculation path 474, which illustrate various fluid flow paths through the solvent filtration system 450. Although illustrated as being coupled between the first tank 462 and the second tank 464 along the second recirculation path 472, it is contemplated that the wet processing chamber 400 (FIG. 4A) may be coupled to the system 450 at various other locations.

Fluid within the system 450 flows from either of the first tank 462, or the second tank 464, through the first pump 466 and the first filter 468 to the second tank 464, or the first tank 462, respectively. For example, fluid present in the chamber 400 flows along path 475B through a first valve 483 through the second recirculation path 472 to the second tank 464. Fluid in the second tank 464 flows along path 471A through a second valve 481 via the first recirculation path 470. Fluid flowing along the first recirculation path 470 flows through the first pump 466 and the first filter 468 through a third valve 482 along path 471B to the first tank 462. The fluid then flows from the first tank 462 via the third recirculation path 474 through the second pump 467 and the second filter 469 to a fourth valve 489. The fourth valve 489 may direct the fluid along path 477A to the second tank 464 or to the second valve 481 along path 473B. Fluid may be recirculated along the first recirculation path 470 and the third recirculation path 474, optionally incorporating the second tank 464, until a contaminant count within the fluid has reached a desirable level. When desired, fluid may be delivered to the chamber 400 along the first recirculation path 470 through the first pump 466 and the first filter 468 through the third valve 482 along path 473C to the first valve 483 and chamber 400 along path 475A. If desired, the fluid may bypass the chamber 400 by flowing through the first valve 483 along path 473C and return to the second tank 464.

Thus, fluid used in the system 450 is recirculated at least two or more times prior to being utilized again in the wet processing chamber 400. The second tank 464 will generally receives contaminated fluid and the first tank 464 only ever contains fluid that has been filtered at least once. It is believed that utilizing the system 450 having multiple recirculation paths incorporating multiple tanks, pumps, and filters provides for a substantially linear decay of contaminants within the fluid when compared to single tank, pump, and filter systems which generally exhibit an exponential decay in removing contaminants from fluid. If desired, new fluid may be provided to the system 450 from the source 460 or may be removed from the system 450 by the fluid drain 461.

In some configurations, a fluid "cleaning" process may be performed on the fluid contained in the system 450. In one example, the fluid in the second tank 464 can be "cleaned," such as having the particle concentration contained therein reduced, by transferring the contents of the second tank 464 along paths 471A and 471B to the first tank 462 and then back to the second tank 464 following paths 473B and 473C. In this process, the fluid delivered from the second tank 464 is filtered once as it passes through filter 468 before it reaches the first tank 462 and then is filtered a second time when it is transferred through filter 468 a second time before it is delivered back to the second tank 464 (e.g., optional pump 467 and filter 469 are not present in the system 450). One will note that this process sequence can be completed one or more times until a desired particle concentration is reached in the fluid. In configurations where the filter 469 is used in the solvent filtration system 450, the fluid can be filtered three times in the process sequence if the original fluid is delivered from the second tank 464 to the first tank 462 following paths 471A and 471B, which filters the fluid once as it passes through the filter 468, and then is filtered a second and a third time when the filtered fluid passes through filters 469 and 468, respectively, on its way back to the second tank 464 following paths 473B and 473C. Alternately, in some configurations, the fluid can be filtered twice if the original fluid is delivered from the second tank 464 to the first tank 462 following paths 471A and 471B, which filters the fluid once, and then is filtered a second time when it passes through filter 469 to the second tank 464 following path 477A. After the cleaning process has been performed, the "cleaned" fluid can be delivered to the processing chamber 400 using the path 475A, as discussed above.

Figure 5A:
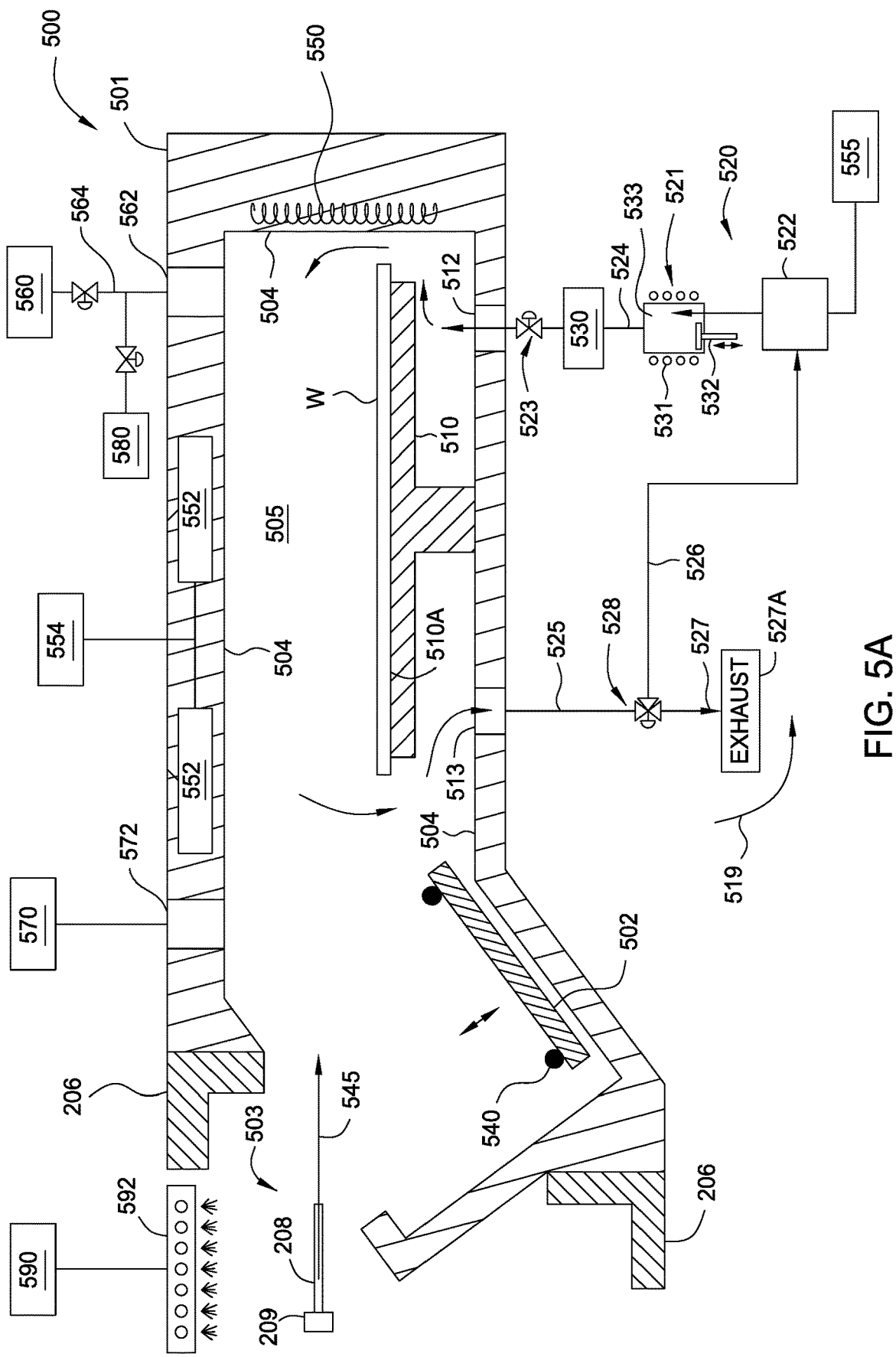
FIG. 5A illustrates a cross-sectional schematic view of a supercritical fluid chamber according to certain embodiments provided herein.

FIG. 5A illustrates a cross-sectional schematic view of a supercritical fluid chamber 500 according to one embodiment. Gas in the supercritical fluid chamber 500 may be a substance that is capable of transitioning into a supercritical state under certain appropriate conditions (e.g. pressure and temperature) to become a supercritical fluid. The supercritical fluids used in the supercritical fluid chamber 500 may be a substance that possesses liquid-like solvating properties and gas-like diffusion and viscosity, which enables the supercritical fluid to rapidly penetrate into voids, pores, gaps, crevices, or openings, and completely remove or dissolve any liquids, residues, or contaminants. One example of such a gas is $CO_2$. Another example of such a gas is $C_3H_8$. Although other commercially available gases can be used to form a supercritical fluid, $CO_2$ is the most commonly used due to its inert, non-toxic, non-flammable characteristics and its abundance in nature. Appropriate conditions to transform $CO_2$ into supercritical fluid $CO_2$ include a pressure of about 1200 psi or greater and a temperature of about 31° C. or greater, as shown in the $CO_2$ phase change diagram of FIG. 6. Appropriate conditions to transform $C_3H_8$ into supercritical fluid $C_3H_8$ include a pressure of about 620 psi ($lbs/in^2$) or greater and a temperature of about 100° C. or greater.

The supercritical fluid chamber 500 may be configured to expose supercritical fluid to a substrate W disposed within the processing volume 505 of the supercritical fluid chamber 500. The supercritical fluid may be formed in the supercritical fluid chamber 500 or it may be formed outside the supercritical fluid chamber 500 and delivered into the supercritical fluid chamber 500. In one configuration, the chamber 500 may be disposed on and coupled to a transfer chamber 206. The chamber 500 comprises a chamber body 501 which defines a processing volume 505. The chamber 500 may be made from stainless steel or other suitable structural materials that enable the chamber 500 to withstand an operating temperature and pressure sufficient to maintain a gas in its supercritical state. In one embodiment, surfaces 504 of the chamber body 501 disposed adjacent to and defining the processing volume 505 may be electrochemically polished to form a surface that has a low surface roughness (e.g., smooth surface). In another embodiment, the surfaces 504 may be coated with a material, such as Teflon® coating or chromium.

A substrate support 510 may be disposed in the processing volume 505 and coupled to the chamber body 501. The substrate support 510 further comprises a support surface 510A configured to receive the substrate W, such as a semiconductor substrate W. The support surface 510A may also be configured to actively restrain the substrate W after the substrate W has been placed on the support surface 510A. For example, the substrate support 510 may utilize electrostatic or vacuum chucking, an edge ring, or retaining pins or the like to prevent the substrate W from moving on the support surface 510A during processing. In another embodiment, the substrate support 510 may comprise a plurality of support pins (not shown). In one embodiment, the substrate support 510 may be configured to rotate the semiconductor substrate W during processing.

In one embodiment, the processing volume 505 comprises a small volume to reduce the amount of supercritical fluid necessary to fill the enclosure. The chamber 500 further comprises a slit valve door 502 comprising one or more O-rings 540 coupled to the slit valve door 502. The O-rings 540 may be formed from an elastomeric material, such as rubber or silicone. A slit valve opening 503 provides access for a wet robot 208 disposed in the transfer chamber 206 to transfer and receive substrates from the processing volume 505 along the substrate transfer path 545.

It is believed that adding more solvent to the substrate W after processing in the solvent exchange chamber 202 will prevent "dry spots" from forming during the supercritical flushing and drying process and further facilitate particle removal and a reduction in stiction between features. A solvent dispensing apparatus 592 may be disposed near the slit valve opening 503. The solvent dispensing apparatus 592, such as a spray bar, is configured to deliver a liquid to the substrate W prior to entry into the chamber 500 through the slit valve opening 503. The solvent dispensing apparatus 592 may be coupled to the chamber body 501 or to the transfer chamber 206. A solvent source 590 is coupled to the solvent dispensing apparatus 592 and configured to provide a liquid solvent, such as IPA, for delivery to a top surface of the substrate W via the solvent dispensing apparatus 592. The solvent dispensing apparatus 592 is configured to deliver a small amount of solvent to the substrate W such that a layer of solvent completely covers the top surface of the substrate W. In another embodiment, it is contemplated that the additional solvent may be provided to the substrate W after the substrate is inside the chamber 500.

The chamber 500 may further comprise one or more heating elements 550 configured to heat the chamber 500 during the formation of supercritical $CO_2$ and/or during depressurization of the chamber 500. The heating elements 550 may be disposed proximate to or inside the processing volume 505 of the chamber body 501. The heating elements 550 may comprise resistive heating elements, fluid channels that are configured to receive a heat control fluid, and/or other similar heating devices. The heating elements 550 may heat the fluid or gas in the processing volume 505 to a desired temperature. In another embodiment, the chamber 500 may include one or more acoustic or sonic transducers 552, such as piezoelectric transducers (e.g., ultrasonic crystals), coupled to the surfaces 504 of the chamber body 501 in the processing volume 505 or embedded within the chamber body 501 to create acoustic or sonic waves for cleaning the chamber 500. In another embodiment, the transducers 552 may be disposed outside the chamber body 501 and be positioned to direct the sonic energy to the processing volume 505 of the chamber body 501. The transducers 552 may be coupled to a power source 554 adapted to provide sufficient power for performing an ultrasonic cleaning process. The transducers 552 may also direct waves towards the substrate W to agitate the supercritical fluid within the chamber 500 during supercritical fluid processing.

A supercritical fluid delivery system 520 comprises a first fluid delivery line 524 coupled to a fluid source 555, such as a $CO_2$ supply or a $C_3H_8$ supply, and a first fluid inlet 512 formed in the chamber 500. A pump 522 may be coupled to the first fluid delivery line 524 between the first fluid inlet port 512 and the fluid source 555 for delivering the pressurized fluid from the fluid source 555 into the processing volume 505 of the chamber 500. Additionally, an inlet valve 523 may be disposed on the first fluid delivery line 524 between the pump 522 and the first fluid inlet port 512 to control the flow of supercritical fluid to the processing volume 505.

Figure 5B:
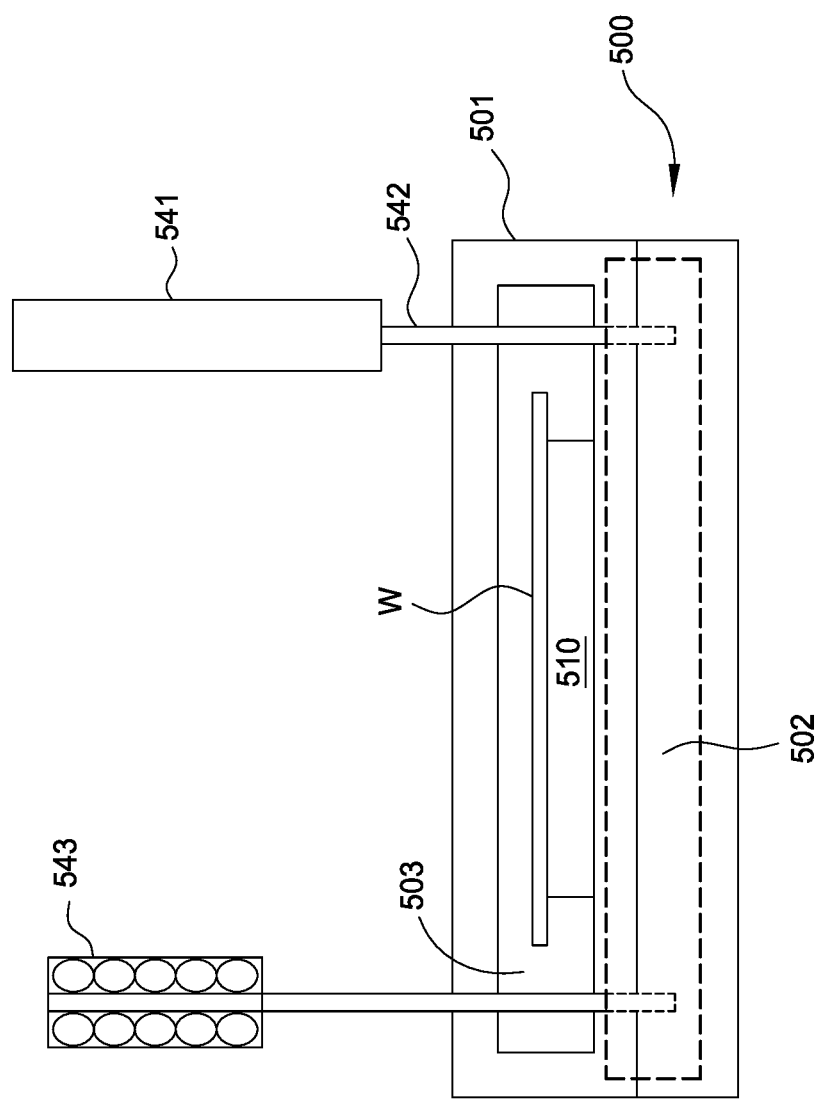
FIG. 5B illustrates a schematic side view of the supercritical fluid chamber of FIG. 5A according to certain embodiments provided herein.
Figure 5C:
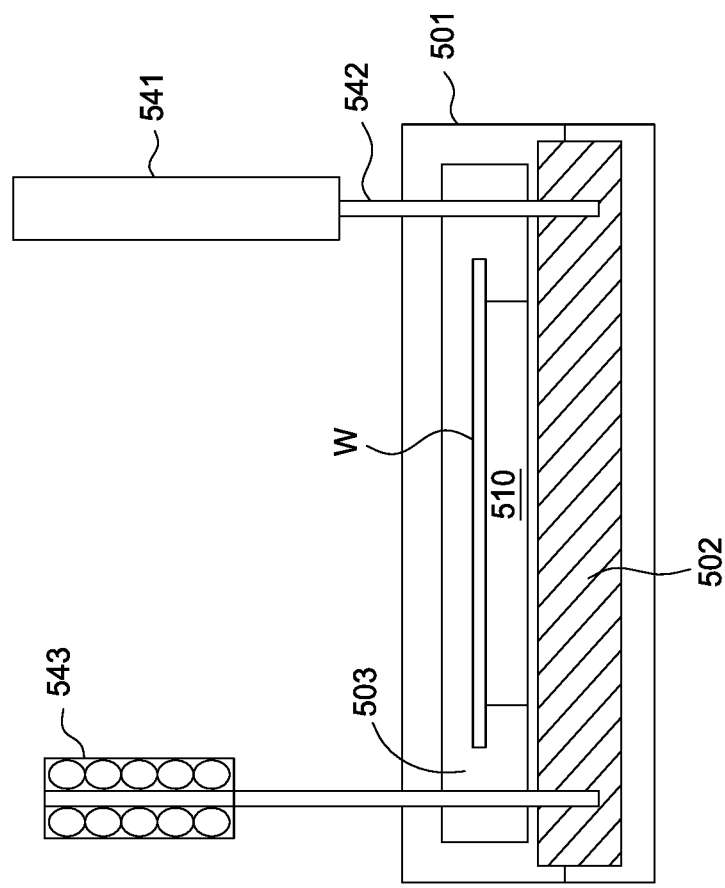
FIG. 5C illustrates a partial cross-sectional schematic view of the supercritical fluid chamber of FIG. 5A according to certain embodiments provided herein.
Figure 5D:
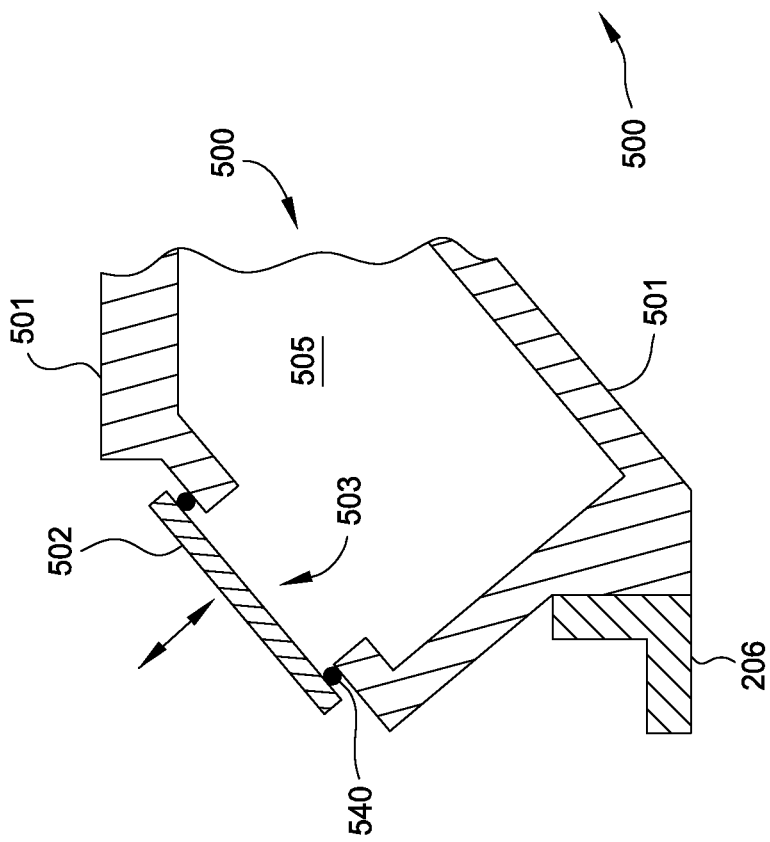
FIG. 5D illustrates a schematic side view of the supercritical fluid chamber of FIG. 5C according to certain embodiments provided herein.
Figure 5E:
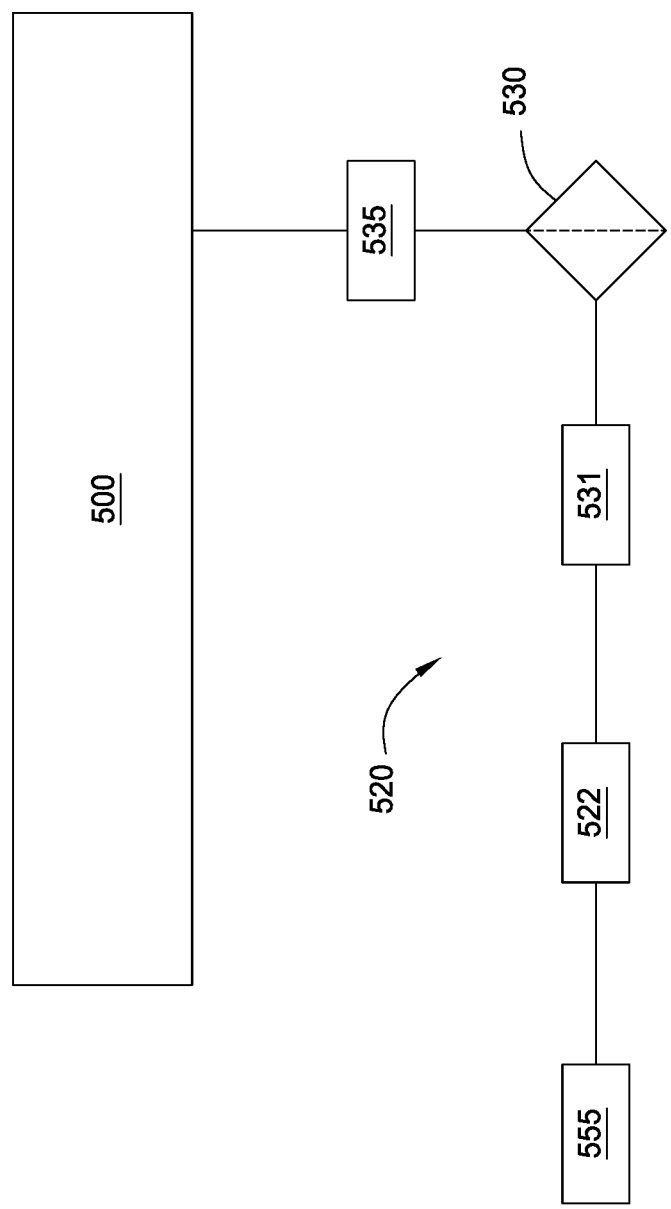
FIG. 5E schematically illustrates a supercritical fluid delivery system according to certain embodiments provided herein.

FIG. 5E schematically illustrates a supercritical fluid delivery system 520 according to another embodiment described herein. The supercritical fluid delivery system 520 comprises the fluid source 555, the pump 522, a heating element 531, a filter 530, and a condenser 535. The fluid delivery system 520 filters fluid in a supercritical state, but then delivers the fluid to the chamber 500 as a liquid. For example, an amount of fluid, such as liquid $CO_2$, is provided from the fluid source 555 to the pump 522, which may pressurize the fluid. The fluid is then heated by the heating element 531 to transform the liquid into its supercritical state. The supercritical fluid is then passed through the filter, which may be a high pressure gas filter, to purify the supercritical fluid. It is believed that a much higher filtration efficiency is achieved utilizing a gas filter as opposed to utilizing a liquid filter. The supercritical fluid is then condensed by the condenser 535 to return the supercritical fluid back to a liquid, which is then provided to the chamber 500. In certain embodiments described in greater detail below, the condenser 535 may be optional to allow the supercritical fluid to be provided directly to the chamber in its supercritical state.

Referring back to FIG. 5A, the chamber 500 may further comprise an optional loop 519 for re-circulating fluid to and from the chamber 500. The loop 519 may further include a filter (not shown), such as an activated charcoal filter, to purify the fluid. The loop 519 helps produce a flow of the supercritical fluid within the processing volume 505, such as a laminar flow, to help prevent stagnation of the supercritical fluid bath.

A fluid outlet 513 may be coupled to the chamber 500 for removal of the supercritical fluid from the processing volume 505. The fluid outlet 513 may release the supercritical fluid to atmosphere, may direct the used supercritical fluid to exhaust 527A and storage, or may recycle the supercritical fluid for re-use (loop 519). As shown, the fluid outlet 513 may be coupled to the pump 522 by a fluid return line 525 and a pump return line 526. An exhaust valve 528 couples the fluid return line 525 and the pump return line 526. The exhaust valve 528 directs the supercritical fluid or gas in the fluid return line 525 to either exhaust 527 (or storage) or to the pump 522 to recycle the supercritical fluid for re-use. Optionally, a condenser (not shown) may be coupled between the fluid outlet 513 and the fluid source 555 to condense the contaminants in the fluid prior to being directed to the fluid source 555.

The first fluid inlet port 512 and fluid outlet 513 may be disposed through a bottom wall of the chamber body 501. However, it is contemplated that the first fluid inlet port 512 and the fluid outlet 513 may be disposed at other areas through the walls of the chamber body 501, such as through a top wall of the chamber body 501. The first fluid inlet port 512 may be adapted to receive a gas, such as $CO_2$. In certain embodiments, the first fluid inlet port 512 may be coupled to nozzles, showerheads, or other fluid delivery devices to direct the fluid towards the substrate.

In certain embodiments, the chamber 500 may comprise a purge gas source 560. The purge gas source 560 may be coupled to a second fluid inlet port 562 via a second fluid delivery line 564. The purge gas source 560 may be adapted to provide a purge gas, such as pure nitrogen ($N_2$), argon (Ar), helium (He), or other high purity gases to the processing volume 505. The chamber 500 may further comprise a pressurization apparatus 570, such as a compressor, adapted to pressurize the processing volume 505 of the chamber 500. The pressurization apparatus 570 may be coupled to the chamber through a pressure valve 572. In one embodiment, the pressurization apparatus 570 may pressurize a gas, such as the purge gas, after the gas has been provided to the processing volume 505. In another embodiment, the pressurization apparatus 570 may be coupled to the purge gas source 560 and may be adapted to pressurize the purge gas prior to delivery to the chamber 500. In operation, the pressurization apparatus 570 may pressurize a purge gas in the chamber 500 to between about 1100 psi and about 2000 psi prior to introduction of the supercritical fluid to the processing volume 505.

The chamber 500 may further comprise a cleaning fluid source 580. The cleaning fluid source 580 may be adapted to provide one or more cleaning liquids, or mixtures thereof, to the chamber 500. Although shown as being coupled to the second fluid delivery line 564, the cleaning fluid source 580 may be coupled to the chamber 500 at any convenient location to lessen the complexity of any associated plumbing. In one embodiment, a fluid supplied by the cleaning fluid source 580 comprises water or N-Methylformamide. In another embodiment, the fluid supplied by the cleaning fluid source 580 comprises acetone ($(CH_3)_2CO$).

An in-situ cleaning process may be performed on the chamber 500 by providing a cleaning fluid, such as water or N-Methylformamide, to the chamber 500 and activating the transducers 552 to ultrasonically agitate the chamber surfaces 504, other chamber components and fluid within the processing volume 505. The cleaning fluid may be provided in a liquid form with a turbulent flow configured to contact all the chamber surfaces 504 and components of the chamber 500. For example, the second fluid inlet port 562 may be angled or configured to provide a turbulent flow within the chamber 500. Subsequent to the ultrasonic agitation, the chamber 500 may be flushed with a solvent, such as acetone, to displace the water or N-Methylformamide used during the ultrasonic agitation. Finally, a purge gas, such as $N_2$, may be provided from the purge gas source 560 to the chamber to further dry the chamber 500 interior. The $N_2$ may be exhausted from the chamber 500 when the chamber 500 has been sufficiently dried. Heat may also be provided to the chamber 500 by the heating element 550 during or after the $N_2$ purge to further assist in drying the chamber 500. In certain embodiments, the in-situ cleaning process may be performed at atmospheric pressure. The in-situ cleaning process may be performed as needed to ensure optimal performance of the chamber 500.

The above embodiments describe a supercritical fluid chamber providing supercritical fluid that may be formed inside the processing volume 505 after a non-supercritical fluid is supplied to the chamber 500. In an embodiment where supercritical fluid is delivered to the chamber 500 already in its supercritical phase, the supercritical fluid delivery system may further comprise a phase transition apparatus 521. The phase transition apparatus 521 may be disposed on the first fluid delivery line 524 between the pump 522 and the first fluid inlet port 512. A filter 530 may be disposed on the first fluid delivery line 524 between the first fluid inlet port 512 and the phase transition apparatus 521. The filter 530 may be capable of operating under pressures of about 3000 psi, or below, to filter the supercritical fluid before it enters the chamber 500 and to remove impurities that may be present in the supercritical fluid. The filter 530 may include a filter medium that has a pore size of about 3 nanometers (nm), and may be formed from an aluminum oxide ($Al_2O_3$) material.

The phase transition apparatus 521 comprises a processing region 533, a compression device 532, and a heating element 531. In one embodiment, the pump 522 supplies $CO_2$ gas from the fluid source 555 to the processing region 533 of the phase transition apparatus 521. The $CO_2$ gas may be pressurized by the compression device 532 and/or heated by the heating element 531 to predetermined levels to create a supercritical fluid therein. In one embodiment, $CO_2$ may heated to about 40° C. and pressurized to about 95 bar. In another embodiment, $C_3H_8$ may be heated to about 100° C. and pressurized to about 620 psi (43 bar). The resulting supercritical $CO_2$ or $C_3H_8$ may then be delivered through the first fluid delivery line 524 to the chamber 500 through the first fluid inlet port 512.

When the substrate W in the chamber 500 has been processed with supercritical $CO_2$, a depressurization process occurs in the chamber. In one embodiment, isothermal depressurization of the chamber 500 requires the chamber 500 remain at a desired temperature, such as about 40° C., while the pressure is reduced to a desired pressure, such as about 21 bar, before the gases remaining in the chamber 500 are vented from the chamber 500. In one example, the depressurization process proceeds at a rate of about 200 psi/min until the pressure within the chamber is about 400 psi. When the pressure is at about 400 psi, a greater depressurization rate may be utilized to further depressurize the chamber 500. The controlled depressurization process is performed in an isothermal environment which requires energy input from the heating element 550 to maintain a desired temperature during depressurization of the chamber. The chamber 500 pressure is reduced by releasing supercritical fluid and/or gases through the fluid outlet 513 to the exhaust 527 or tank (not shown) formed within the pump 522. The gas removed from the chamber 500 to exhaust 527A travels through the fluid return line 525 to the exhaust valve 528 which may be selected to exhaust 527A or return the gas to the pump 522 through the pump return line 526. The substrate W may be optionally heated during venting to prevent cooling of the substrate and to prevent moisture uptake or deposition.

FIG. 5B illustrates a schematic side view of the supercritical fluid chamber 500 of FIG. 5A according to one embodiment. The slit valve door 502 may be coupled to a shaft 542 which may be coupled to a linear actuator 541. In one embodiment, two shafts 542 may be coupled to the slit valve door 502, the first shaft may be coupled to a linear actuator 541 and the second shaft may be coupled to a linear bearing 543. The linear actuator may comprise a motor or air cylinder that may be coupled to a fluid source (not shown), such as a liquid or a gas source, to extend and retract the shaft 542 to position the slit valve door 502 to seal and unseal the slit valve opening 503. The slit valve door 502 may be closed when the linear actuator 541 retracts the shaft 542 and compresses the O-rings (not shown) coupled to the slit valve door 502 against a sidewall of the chamber body 501. In one embodiment, the slit valve door 502 compresses the O-rings with sufficient force against a sidewall of the chamber body 501 to form an airtight seal to withstand the pressure created inside the supercritical fluid chamber 500 during processing.

FIG. 5C illustrates a partial cross-sectional view of the supercritical fluid chamber 500 of FIG. 5A. Similar to the chamber 500, a slit valve door 502 comprising one or more O-rings 540 may open and close the slit valve 503 along the substrate transfer path. However, in the embodiment shown, the slit valve door 502 may be disposed outside of the processing volume 505 and may contact an exterior surface of the chamber body 501. When the slit valve door 502 is disposed outside of the processing volume 505, the volume of the processing volume 505 may be reduced. A reduction in the processing volume 505 may provide greater control over the temperature and pressure, and reduce the amount of energy required to maintain the processing volume 505 under conditions necessary for supercritical processing.

FIG. 5B illustrates a schematic side view of the supercritical fluid chamber 500 of FIG. 5C according to one embodiment. The slit valve door 502 may be coupled to a shaft 542, which may be coupled to a linear actuator 541. In one embodiment, two shafts 542 may be coupled to the slit valve door 502, the first shaft may be coupled to a linear actuator 541 and the second shaft may be coupled to a linear bearing 543. The linear actuator may comprise a motor or air cylinder that may be coupled to a fluid source (not shown), such as a liquid or a gas source, to extend and retract the shaft 542 to position the slit valve door 502 to seal and unseal the slit valve opening 503. The slit valve door 502 may be closed when the linear actuator 541 retracts the shaft 542 and compresses the O-rings (not shown) coupled to the slit valve door 502 against an exterior of the chamber body 501. In one embodiment, the slit valve door 502 compresses the O-rings with sufficient force against the exterior of the chamber body 501 to form an airtight seal to withstand the pressure created inside the supercritical fluid chamber 500 during processing. As shown, the slit valve door 502 may be disposed outside the processing volume 505 which may further reduce the volume of the processing volume 505 necessary for the chamber 500 to perform supercritical fluid processing. Further, the slit valve door 502 disposed outside the processing volume 505 may reduce the potential for particle generation within the chamber 500.

Figure 7:
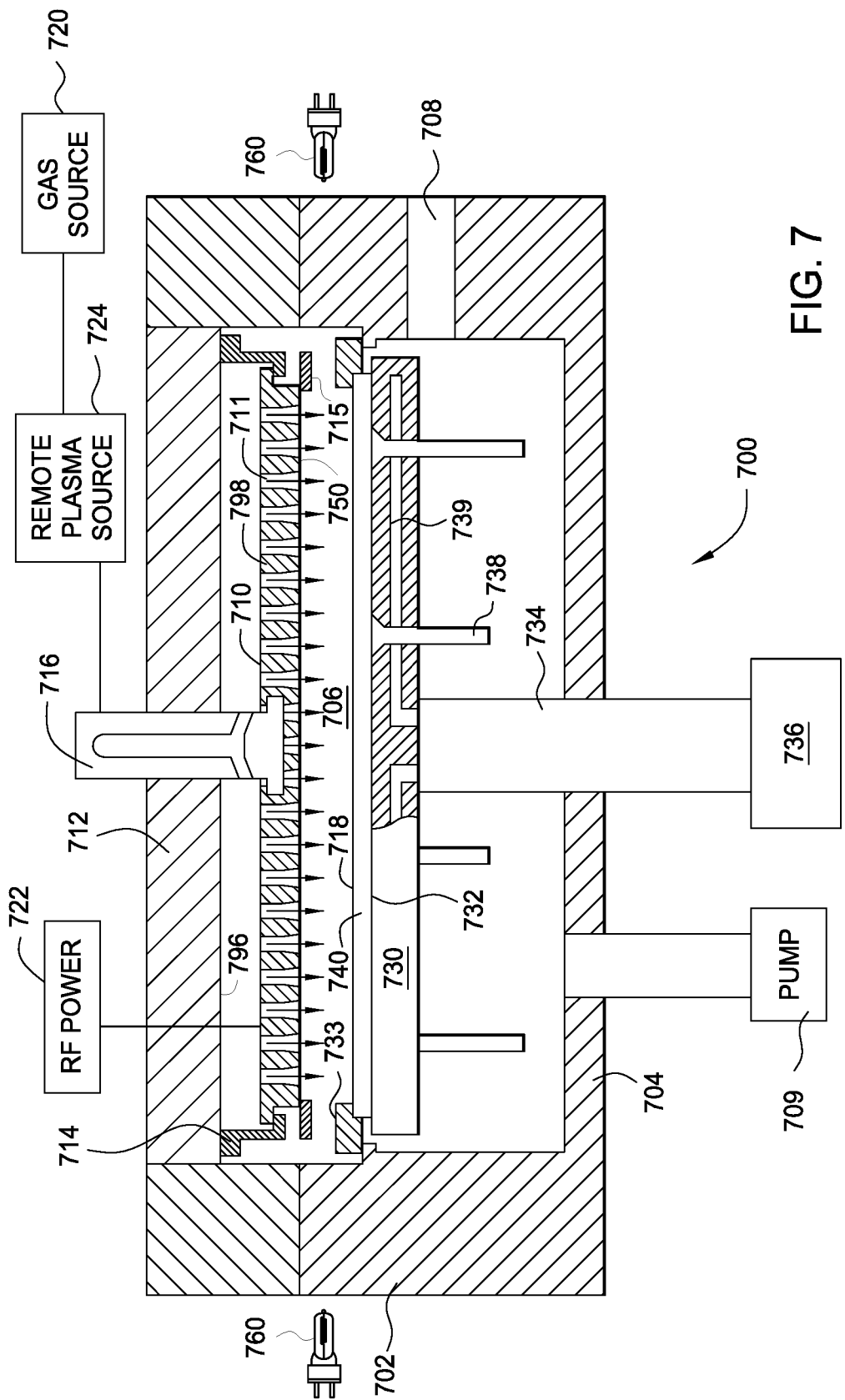
FIG. 7 illustrates a cross-sectional view of a plasma chamber according to certain embodiments provided herein.

FIG. 7 illustrates a cross-sectional view of a plasma chamber according to one embodiment. More specifically, FIG. 7 provides a plasma generation chamber 700. The chamber 700 generally includes walls 702 and a bottom 704 which encloses a process volume 706. A gas distribution plate 710 and substrate support assembly 730 may be disposed in the process volume 706. The process volume 706 may be accessed through a slit valve opening 708 formed through the wall 702 which enables a substrate 740 to be transferred in and out of the chamber 700. Although illustratively shown as a plasma chamber, the chamber 700 may also be adapted to irradiate the substrate with electromagnetic energy, such as irradiate the substrate with light containing one or more of the ultraviolet wavelengths.

The substrate support assembly 730 includes a substrate receiving surface 732 for supporting the substrate 740 thereon. A stem 734 couples the support assembly 730 to a lift system 736, which raises and lowers the substrate support assembly 730 between substrate transfer and processing positions. A shadow frame 733 may be optionally placed over a periphery of the substrate 740 when processing to prevent deposition on the edge of the substrate 740.

Lift pins 738 may be moveably disposed through the substrate support assembly 730 and may be configured to space the substrate 740 from the substrate receiving surface 732 to facilitate exchange of the substrate with a robot blade. The substrate support assembly 730 may also include heating and/or cooling elements 739 utilized to maintain the substrate support assembly 730 at a desired temperature.

The gas distribution plate 710 may be coupled to a backing plate 712 and its periphery by a suspension 714. The gas distribution plate 710 may also be coupled to the backing plate 712 by one or more center supports 716 to help prevent and/or control the straightness/curvature of the gas distribution plate 710. In one embodiment, the gas distribution plate 710 may be in different configurations with different dimensions. The distribution plate 710 may comprise a plurality of perforations 711 disposed between the upper surface 798 and lower surface 750 of the distribution plate 710. A gas source 720 may be coupled to the backing plate 712 to provide gas to a plenum defined between the gas distribution plate 710 and backing plate 712. The gas from the source 720 flows from the perforations 711 formed in the gas distribution plate 710 to the process volume 706.

A vacuum pump 709 may be coupled to the chamber 700 to maintain the process volume 706 at a desired pressure. An RF power source 722 may be coupled to the backing plate 712 and/or to the gas distribution plate 710 to provide an RF power to create an electric field between the gas distribution plate 710 and the substrate support assembly 730 so that a plasma may be generated from the gases present between the gas distribution plate 710 and the substrate support assembly 730. Various frequencies, such as a frequency of 13.56 MHz, may be used to form the plasma in the process volume 706. In one embodiment, $O_2$ plasma may be applied to the substrate 740 at about 75 W for about 10 seconds. The additional plasma treatment may be capable of releasing minor or temporary stictions in the high-aspect ratio trenches. It is believed that the $O_2$ plasma is particularly useful for removing organic impurities that may be present in the trenches.

A remote plasma source 724, such as an inductively coupled remote plasma source, may also be coupled between the gas source 720 and the backing plate 712. The RPS 724 may be used to form a plasma in the processing volume 706. The plasma travels through the processing volume 706 to a top surface 718 of the substrate 740. The plasma processes the substrate 740 by removing stictions that may be present between the device features. In one embodiment, an electromagnetic radiation source 760, such as an ultraviolet light source, may be coupled to the chamber 700. The electromagnetic radiation source 760 may be coupled to a power source (not shown) and may be positioned at any convenient location either inside the chamber 700 or outside the chamber 700. In one configuration, the electromagnetic radiation source 760 is positioned outside the chamber 700 so that it can transmit the generated electromagnetic energy through a window (not shown), which may be coupled to a portion of a wall 702 of the chamber 700, to the substrate's surface. The electromagnetic radiation source 760 may be positioned to irradiate the top surface 718 of the substrate 740. The electromagnetic radiation source 760 may be adapted to provide ultraviolet light to the substrate 740 having a wavelength between about 50 nm and about 500 nm.

Figure 8:
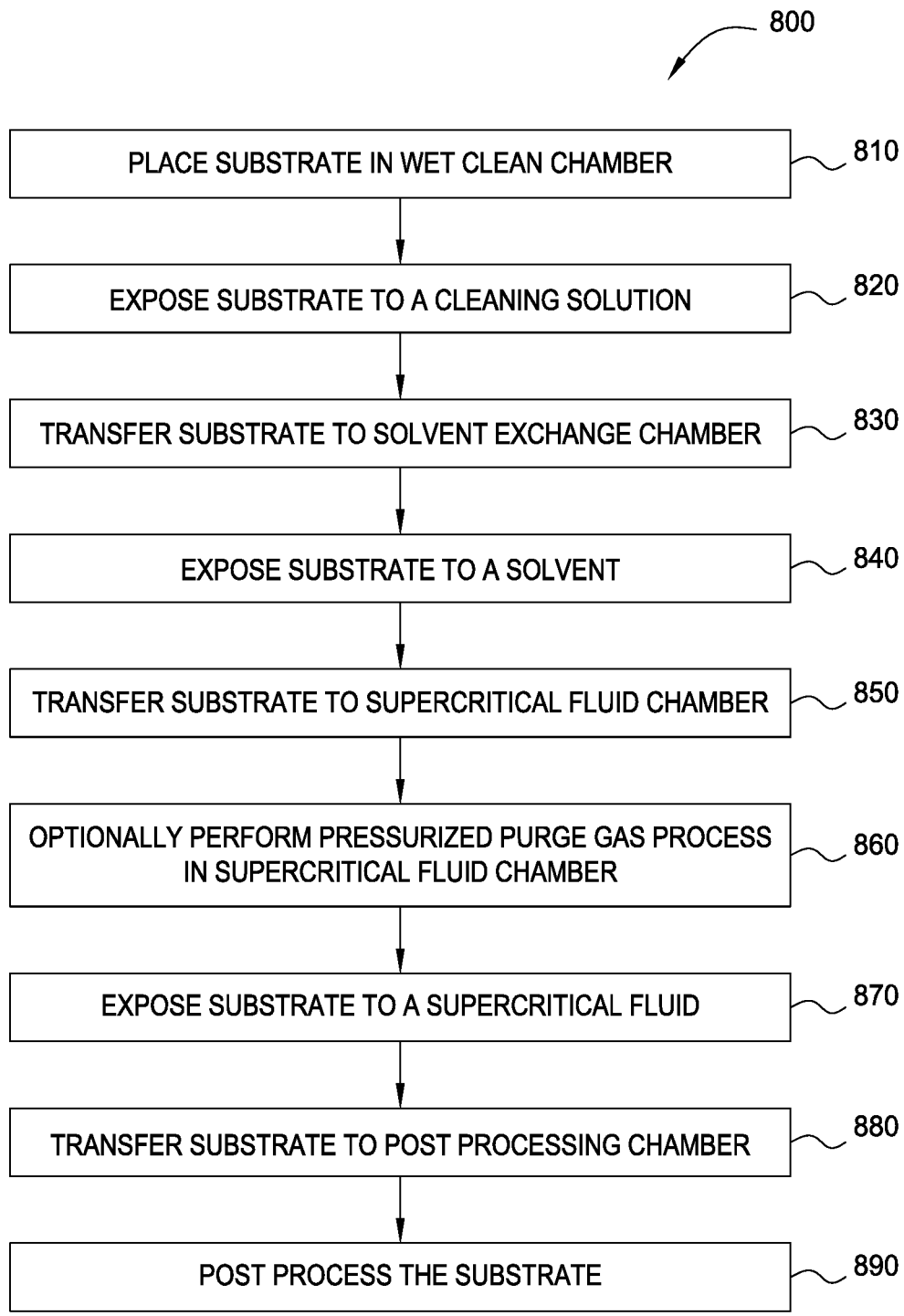
FIG. 8 illustrates a flow diagram of method steps for cleaning a substrate according to certain embodiments provided herein.

FIG. 8 illustrates a process flow diagram containing method steps for cleaning a substrate according to one embodiment. A substrate may be processed first in a film deposition or etching chamber to form a film or features on the substrate. The method 800 begins at operation 810 where a substrate may be placed in a wet clean chamber. The substrate may be provided to the wet clean chamber by a dry robot which removes the substrate to be cleaned from a cassette. At operation 820, the substrate may be exposed to a cleaning solution to remove residues or liquids present on the substrate. In one embodiment, the cleaning solution may comprise deionized water, solvents, or a combination thereof.

At operation 830, the substrate may be transferred by a wet robot to a solvent exchange chamber. At operation 840, the previously applied cleaning solution may be displaced by a solvent by exposing the substrate to a solvent delivered to the substrate that is disposed in the solvent exchange chamber. In one embodiment, the solvent used to displace the cleaning solution may be a chemical, which may be in either a liquid or supercritical phase, or a sequence of chemicals or mixtures thereof in a liquid or supercritical phase. The condition and phase of the chemicals or mixtures for displacement of the residual material on the substrate may be determined by the relative solubility and miscibility among the cleaning solution constituents (e.g., deionized water), solvents, and the chemicals or mixtures thereof chosen. In one example, the solvents may be selected from the group consisting of acetone, isopropyl alcohol, ethanol, methanol, N-Methyl-2-pyrrolidone, N-Methylformamide, 1,3-Dimethyl-2-imidazolidinone, dimethylacetamide, and dimethyl sulfoxide or combinations and/or sequences thereof. In one embodiment, an organic polar solvent may be provided to the surface of the substrate in a sufficient amount to displace the cleaning solution remaining on the surface of the substrate. In a subsequent operation, a non-polar solvent may be provided to displace the organic polar solvent. In one embodiment, the organic polar solvent is selected from N-Methyl-2-pyrrolidone and/or N-Methylformamide and the non-polar solvent is selected from acetone and/or IPA. In another embodiment, the solvent exchange may performed by a fill and purge process by providing the solvent to fill the chamber and after the solvent exchange has been performed on the substrate for a desired amount of time, purging the solvent from the solvent exchange chamber.

In another embodiment, as noted above, suitable solvents for the solvent exchange include N-Methyl-2-pyrrolidone, N-Methylformamide, 1,3-Dimethyl-2-imidazolidinone, dimethylacetamide, and dimethyl sulfoxide. These organic polar solvents may be used to displace water, and the desirable solvents will generally have a high dielectric constant (greater than 30) and a low evaporation rate (less than 0.5 relative to n-Butyl Acetate). The organic polar solvents are also generally miscible in water and suppress precipitation of silica from the silicon-water interaction. Optionally, the organic polar solvents may be combined with dissolved $O_2$ gas during the solvent exchange to enhance particle removal. In a preferred embodiment, the organic polar solvents comprise N-Methyl-2-pyrrolidone or N-Methylformamide, or combinations thereof.

In one embodiment, if the chemicals or chemical mixtures used in the displacement process are liquid, a phase transition process may be used to convert the chemicals or chemical mixtures to a supercritical fluid. In one embodiment, 90 percent or greater liquid IPA used to displace the organic polar solvent may be displaced by liquid $CO_2$ at about 5-8° C. and about 50 bar. The about 5-8° C. and about 50 bar liquid $CO_2$ described above may be heated to about 40° C. and about 95 bar in the solvent exchange chamber. As a result of the supercritical phase, capillary pressure due to the difference between liquid-gas and liquid-solid surface tension is eliminated. The elimination of capillary pressure prevents bending and stiction of high-aspect-ratio features that often occur after performing a wet clean process (operation 810).

At operation 850, the substrate is then transferred from the solvent exchange chamber by the wet robot to the supercritical fluid chamber. Optionally, at operation 860, a pressurized purge gas process may be performed in the supercritical fluid chamber. A purge gas, such as pure $N_2$ or Ar may be provided to the supercritical fluid chamber which may be pressurized. The supercritical fluid chamber may be pressurized to between about 1100 psi and about 2000 psi.

At operation 870, supercritical fluid comprising the same types of chemicals or chemical mixtures, as previously described above, is formed and introduced to the supercritical fluid chamber to clean and flush away particles and residues remaining on the surface of the substrate in a supercritical flushing process. The purge gas, which may be present in the supercritical fluid chamber if optional operation 860 has been performed, may be exhausted as the supercritical fluid is provided to the supercritical fluid chamber. In this embodiment, an inconsequential change in pressure in the supercritical fluid chamber between the purge gas process and the supercritical flushing process may be achieved. Maintaining substantially the same pressure in the supercritical fluid chamber between operation 860 and operation 870 may prevent the formation of particles in the supercritical fluid chamber. As such, the pressure of the supercritical fluid chamber in optional operation 860 may be selected to match the pressure required to maintain a supercritical fluid within the chamber in operation 870.

In one embodiment, $CO_2$ may be used to form a supercritical fluid used during operation 870. In another embodiment, $C_3H_8$ may be used to form a supercritical fluid. The supercritical $CO_2$ or $C_3H_8$ may be formed in the supercritical fluid chamber or may be formed outside the supercritical fluid chamber and then introduced to the supercritical fluid chamber. In one embodiment, supercritical $CO_2$ at about 40° C. and about 95 bar is formed outside the supercritical fluid chamber and then introduced to the supercritical fluid chamber so that it maintains its supercritical fluid properties. In one embodiment, supercritical $C_3H_8$ at about 100° C. and about 620 psi (43 bar) is formed outside the supercritical fluid chamber and then introduced to the supercritical fluid chamber so that it maintains its supercritical fluid properties. In one embodiment, the supercritical fluid remains a supercritical fluid throughout the process of introducing it into the supercritical chamber. In another embodiment, the supercritical fluid is a supercritical fluid part of the way into the introduction process or only at the end of the introduction process.

If the chemicals or chemical mixtures used in the displacement process are liquid, a phase transition process may be used to convert the chemicals or chemical mixtures to a supercritical fluid. In one embodiment, 90 percent or greater liquid IPA used to displace the organic polar solvent may be displaced by liquid $CO_2$ at about 5-8° C. and about 50 bar. The about 5-8° C. and about 50 bar liquid $CO_2$ described above may be heated to about 40° C. and about 95 bar in the supercritical fluid chamber. As a result of the supercritical phase, capillary pressure due to the difference between liquid-gas and liquid-solid surface tension is eliminated. The elimination of capillary pressure prevents bending and stiction of high-aspect-ratio features. It is also contemplated that $C_3H_8$ may be used to convert the chemicals or chemical mixtures to a supercritical fluid.

The supercritical fluid exhibits properties intermediate between a gas and a liquid and generally has the ability to penetrate well into intricate nano-geometries due to gas-like transport behaviors and is effective in particle and residue removal, due to its excellent mass-transfer capabilities commonly associated with liquids. The supercritical flushing process may proceed in several manners, both of which remove contaminants from the device features. A first manner of contaminant removal involved the supercritical fluid physically removing the contaminants from the device features by mechanical action, such as physical interaction between the supercritical fluid and the contaminants. The supercritical fluid penetrates the spaces (high-aspect ratio structures, vias, voids, pores, etc.) in the device structure and provides a fluid flow that flushes away contaminants, such as solvents, residues, and particles, from the device structures. The mechanical or physical action created by the flowing fluid is benefitted by the liquid-like mass transfer properties that are exhibited by supercritical fluid.

Another manner in which contaminants are removed is by the creation of a concentration gradient with the non-contaminant containing supercritical fluid. The supercritical fluid present in the processing volume above the surface of the substrate exhibits a lower contaminant concentration than is present in the device structures. In one embodiment, pure supercritical $CO_2$ or $C_3H_8$ is allowed to stagnate in, or even flow through, the volume above the surface of the substrate. Given the desire of fluids to exist at thermodynamic equilibrium, supercritical fluid containing contaminants near the device structures diffuse to the area above the substrate, thereby reducing the concentration of contaminants present in the device structures. It is also possible that both manners of contaminant removal may work simultaneously, such as by use of diffusion mass transfer processes and physical interaction, to remove contaminants from the device structures. In both manners of contaminant removal, or combinations thereof, contaminants may be effectively removed from the device structures.

Next, the substrate is subjected to a supercritical drying process. The process may be controlled to ensure a phase transfer of the chemicals or chemical mixtures from a supercritical to gaseous state without crossing over the liquid region. FIG. 6 shows the phase change of $CO_2$. The process ensures the supercritical fluid (area beyond the dashed line) changes to a gaseous state without crossing over the line separating the liquid and gaseous phases. The fluids expelled from the high-aspect-ratio trenches during the supercritical drying process exhibit a negligible surface tension which results in the reduction or elimination of line stiction. In one embodiment, the supercritical $CO_2$ at about 40° C. and about 95 bar undergoes isothermal depressurization at about 40° C. until the pressure drops to about 21 bar. In another embodiment, the supercritical $C_3H_8$ at about 100° C. and about 620 psi (43 bar) undergoes isothermal depressurization at about 100° C. until the pressure drops to about 20 bar. The gasses remaining in the supercritical fluid chamber are vented from the chamber. The gasses vented from the chamber carry with them the particles and residues taken from the high-aspect-ratio trenches and other surfaces of the substrate.

At step 880, the substrate is transferred from the supercritical fluid chamber by the wet robot to the post processing chamber. At step 890, the substrate is post processed by exposing the substrate to a plasma at a low power for final treatment to complete the drying process. In one embodiment, an RF oxygen ($O_2$) plasma may be applied to the substrate at an RF power of about 75 W and frequency of 13.56 MHz for about 10 seconds. The post processing of the substrate releases minor or temporary stiction, if any, caused by local impurities created by the chemicals or chemical mixtures that were used in previous cleaning processes. The post processing is most effective if implemented immediately after the supercritical drying process. In another embodiment, organic contaminations remaining on the substrate may be removed with biased plasma. It is also believed that deposition or formation of a passivation layer on the surface of the substrate may reduce the probability of stiction between high-aspect ratio features present on the surface of the substrate.

In an alternative embodiment, step 890 may comprise post processing the substrate by exposing the substrate to one or more wavelengths of electromagnetic energy, such as ultraviolet (UV) light. In one example, UV treatment may be selected based upon the materials present on the substrate. The substrate may be exposed to UV light for an amount of time suitable to release any remaining minor or temporary stiction, if any, caused by local impurities created by the chemicals or chemical mixtures that were used in previous cleaning processes. In one embodiment, the substrate may be exposed to UV light having a wavelength between about 50 nm and about 500 nm, such as between about 150 nm and about 350 nm, such as between about 172 nm and about 300 nm. Similar to the plasma treatment described above, the UV treatment may be most effective if implemented immediately after the supercritical drying process. In another embodiment, step 890 may comprise a combination of plasma and UV treatments to post process the substrate and remove any remaining stiction or organic contamination that may be present on the substrate.

The aforementioned disclosure provides an apparatus that increases throughput of substrates during a supercritical cleaning and drying process. The Utilizing a carousel configuration and multiple robots increases the processing apparatus' efficiency which should reduce the cost of supercritical cleaning and drying of substrates. Moreover, utilizing displacement, phase transition, supercritical flushing and drying, and plasma post processing in combination with each other provides the elimination of line stiction after wet cleaning, especially for substrates with high-aspect-ratio trenches.

While the foregoing is directed to embodiments of the present disclosure, other and further embodiments of the present disclosure may be devised without departing from the basic scope thereof, and the scope thereof is determined by the claims that follow.

The invention claimed is:

1. A method of cleaning a substrate, comprising:
exposing a substrate having high aspect ratio features formed thereon to a first solvent to remove an amount of a residual cleaning solution disposed on a surface of the substrate;
exposing the high aspect ratio features to a second solvent to remove the first solvent disposed on the surface of the substrate;
exposing the high aspect ratio features to a supercritical fluid to remove the second solvent disposed on the surface of the substrate; and
exposing the high aspect ratio features to a plasma consisting of oxygen plasma, and electromagnetic energy.

2. The method of claim 1, wherein the electromagnetic energy comprises electromagnetic energy having a wavelength between about 50 nm and about 500 nm.

3. The method of claim 1, wherein the electromagnetic energy comprises electromagnetic energy having a wavelength between about 172 nm and about 300 nm.

4. The method of claim 1, wherein the exposing the high aspect ratio features to the electromagnetic energy occurs after exposing the high aspect ratio features to the supercritical fluid.

5. The method of claim 1, wherein exposing the substrate to the supercritical fluid further comprises:
transitioning a gas to a supercritical state to form the supercritical fluid;
flowing the supercritical fluid over the high aspect ratio features; and
transitioning the supercritical fluid to a gaseous state.

6. The method of claim 5, wherein the gas comprises CO2.

7. The method of claim 6, wherein the CO2 is heated to about 40° C. while maintaining a pressure of at least 95 bar.

8. The method of claim 5, wherein the transitioning the supercritical fluid to the gaseous state further comprises isothermally depressurizing the supercritical fluid comprising supercritical CO2.

9. A method of cleaning a substrate, comprising:
exposing a substrate having high aspect ratio features formed thereon to a first solvent to remove an amount of a residual cleaning solution disposed on a surface of the substrate;
exposing the high aspect ratio features to a second solvent to remove the first solvent disposed on the high aspect ratio features;
exposing the high aspect ratio features to a supercritical fluid to remove the second solvent disposed on the high aspect ratio features, wherein exposing the substrate to supercritical fluid comprises:
transitioning a gas to a supercritical state to form the supercritical fluid;
flowing the supercritical fluid over the high aspect ratio features; and
transitioning the supercritical fluid to a gaseous state; and
exposing the high aspect ratio features to a plasma consisting of oxygen plasma, and electromagnetic energy after exposing the high aspect ratio features to a supercritical fluid.

10. The method of claim 9, wherein the electromagnetic energy comprises electromagnetic energy having a wavelength between about 50 nm and about 500 nm.

11. The method of claim 9, wherein the gas comprises CO2.

12. The method of claim 11, wherein the CO2 is heated to about 40° C. while maintaining a pressure of at least 95 bar.

13. The method of claim 9, wherein the transitioning the supercritical fluid to the gaseous state further comprises isothermally depressurizing the supercritical fluid comprising supercritical CO2.

14. A method of cleaning a substrate, comprising:
exposing a substrate having high aspect ratio features formed thereon to a first solvent to remove an amount of a residual cleaning solution disposed on the high aspect ratio features;
exposing the high aspect ratio features to a second solvent to remove the first solvent disposed on the high aspect ratio features;
exposing the high aspect ratio features to a supercritical fluid to remove the second solvent disposed on the high aspect ratio features, wherein exposing the substrate to supercritical fluid comprises:

transitioning a gas to a supercritical state to form the supercritical fluid;

flowing the supercritical fluid over the high aspect ratio features; and transitioning the supercritical fluid to a gaseous state; and exposing the high aspect ratio features to a plasma consisting of oxygen plasma, and electromagnetic energy after exposing the high aspect ratio features to a supercritical fluid, wherein the high aspect ratio features are exposed to the plasma at a power of about 75 W.

15. The method of claim 14, wherein the transitioning the supercritical fluid to the gaseous state further comprises isothermally depressurizing the supercritical fluid comprising supercritical $CO_2$.

16. The method of claim 14, wherein the high aspect ratio features have aspect ratios of 10:1 or greater, or wherein the high aspect ratio features have aspect ratios of from about 10:1 to about 30:1.

17. The method of claim 14, wherein the high aspect ratio features are exposed to the plasma for about 10 seconds.

* * * * *